(12) United States Patent  
Fujiyama et al.

(10) Patent No.: US 7,023,685 B2
(45) Date of Patent: Apr. 4, 2006

(54) SHEET CAPACITOR, IC SOCKET USING THE SAME, AND MANUFACTURING METHOD OF SHEET CAPACITOR

(75) Inventors: Terumi Fujiyama, Yamaguchi (JP);
Kazuo Fukunaga, Yamaguchi (JP);
Morihiro Fukuda, Yamaguchi (JP);
Yoshiaki Kuwada, Yamaguchi (JP);
Hiromasa Mori, Yamaguchi (JP);
Yoshio Hashimoto, Yamaguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 10/695,197

(22) Filed: Oct. 29, 2003

(65) Prior Publication Data

US 2004/0145877 A1    Jul. 29, 2004

(30) Foreign Application Priority Data

| Oct. 30, 2002 | (JP) | ............................. 2002-315710 |
| Nov. 13, 2002 | (JP) | ............................. 2002-329450 |
| Nov. 19, 2002 | (JP) | ............................. 2002-334824 |
| Jan. 10, 2003 | (JP) | ............................. 2003-004453 |
| Jan. 30, 2003 | (JP) | ............................. 2003-021820 |
| Jan. 31, 2003 | (JP) | ............................. 2003-023773 |
| May 13, 2003 | (JP) | ............................. 2003-134087 |
| May 13, 2003 | (JP) | ............................. 2003-134088 |

(51) Int. Cl.
*H01G 4/228* (2006.01)

(52) U.S. Cl. .................. 361/306.1; 361/763; 361/765; 361/766; 361/785; 439/70; 439/71; 439/342; 174/252; 174/255; 174/262

(58) Field of Classification Search ................ 361/303, 361/306.1, 763, 765, 766, 785; 439/70, 71, 439/342; 174/252, 255, 262
See application file for complete search history.

(56) References Cited

U.S. PATENT DOCUMENTS

| 5,168,432 | A * | 12/1992 | Murphy et al. ............. 361/813 |
| 6,176,709 | B1 * | 1/2001 | Sonobe et al. ................ 439/69 |
| 6,384,341 | B1 * | 5/2002 | Rothermel et al. ......... 174/255 |
| 6,558,181 | B1 * | 5/2003 | Chung et al. ................ 439/342 |
| 6,593,535 | B1 * | 7/2003 | Gailus ........................ 174/262 |
| 6,723,927 | B1 * | 4/2004 | Fan et al. .................... 174/262 |

FOREIGN PATENT DOCUMENTS

JP    60-1360150    7/1987

* cited by examiner

*Primary Examiner*—Dean A. Reichard
*Assistant Examiner*—Nguyen T. Ha
(74) *Attorney, Agent, or Firm*—Wenderoth, Lind & Ponack, L.L.P.

(57) ABSTRACT

A sheet capacitor of the invention has a contact portion formed in a through-hole requiring electrical connection with an IC connection pin among the through-holes in which the IC connection pins are inserted, and a capacitor element connected to the contact portion. Another sheet capacitor of the invention includes an insulating board and a capacitor element mounted on the insulating board. The insulating board has a connection land with an IC at the upper side, and a connection land with a printed wiring board at the lower side. The capacitor element and connection lands at the upper and lower side of the insulating board are connected with each other electrically. In any one of these configurations, a capacitor element of large capacity and low ESL is connected closely to the IC, and the mounting area of the peripheral circuits of the IC can be increased.

7 Claims, 29 Drawing Sheets

SHEET CAPACITOR, IC SOCKET USING THE SAME, AND MANUFACTURING METHOD OF SHEET CAPACITOR

TECHNICAL FIELD

The present invention relates to a sheet capacitor used in noise absorbing and filtering of a high speed IC or processor, an IC socket using the same, and a manufacturing method of the sheet capacitor.

BACKGROUND ART

Recently, personal computers and communication appliances are much more advanced in speed, and electronic components used therein are required to be reduced in size and have sufficient measures against higher frequencies. Accordingly, a capacitor, one of such electronic components, is demanded to be larger in capacity and lower in impedance. In particular, a CPU driving power supply circuit of a computer is required to have a sufficient absorbing performance of noise and ripple current as a high frequency countermeasure in circuit design. There is hence a stronger demand for an electrolytic capacitor of low ESR (equivalent series resistance), low ESL (equivalent series inductance), high ripple current resistance and large capacity. To meet such demand, at the present, a multiplicity of small chip capacitors are disposed around the CPU at close positions to the CPU.

FIG. 53 shows a peripheral area of a CPU in a conventional configuration. Connection pins (hereinafter called pins) 402 are provided at the lower side of an IC 401 represented by a CPU. An IC socket (hereinafter called socket) 403 is soldered to a printed circuit board (hereinafter called board) 404. Chip capacitors (hereinafter called capacitors) 405 are mounted closely to the IC 401 composed in this manner. A similar mounting arrangement, using resistors instead of the capacitors in the configuration described above, is disclosed, for example, in Japanese Unexamined Patent Publication No. S60-130150.

The IC 401 has 478 of pins 402, and a distributing wiring pattern (not shown) from the IC 401 is provided on the board 404 mounting the socket 403. In such mounting manner, as the number of components to be mounted increases, the mounting positions of the capacitors 405 around the IC 401 and other electronic components not shown in the drawing are moved away from the IC 401, and there becomes a sortage of mounting area.

On the other hand, the operating frequency of the CPU continues to go up, and in order to absorb noise and supply current, chip capacitors of large capacity, low ESR and low ESL must be disposed as close to the CPU as possible. It is now hard to meet such demand by the present technology.

Specifically, the height of the socket 403 is about 3 mm, and the distance from the socket 403 to the capacitors 405 is about tens of millimeters, and the ESL becomes higher relative to the CPU, and the impedance rises as the frequency becomes higher. As a result, the performance of the capacitors of low ESL cannot be exhibited sufficiently in a high frequency.

SUMMARY OF THE INVENTION

A first sheet capacitor of the invention has a contact portion formed in a through-hole requiring electrical connection with IC connection pins among the through-holes in which IC connection pins are inserted, and a capacitor element connected to the contact portions.

A second sheet capacitor of the invention has a land for connection with an IC on the upper side, and a land for connection with a printed circuit board on the lower side. Capacitor elements are connected to these lands.

A third sheet capacitor of the invention includes a positive sheet having a positive electrode on one side, a negative sheet having a negative electrode on one side, an electrolyte disposed between the two sheets, and a sealing sheet for sealing the electrolyte. The sealing sheet is disposed between the positive sheet and negative sheet, and is integrally bonded to the positive sheet and negative sheet.

An IC socket of the invention has a slide portion having the first sheet capacitor, and a bracket portion slidably engaged with the slide portion. The bracket portion is coupled with a printed circuit board. The bracket portion has through-holes in which IC connection pins are inserted. Of these through-holes, a through-hole requiring electrical connection with the IC connection pin has a fixed contact point. The bracket portion also has a drive mechanism for sliding the slide portion.

In a method of manufacturing a sheet capacitor of the invention, first, an insulating sheet is placed between a conductive negative sheet and a conductive positive sheet. The insulating sheet has relief through-holes previously formed in the contact-free fitting portions of all IC connection pins. The negative sheet and positive sheet have relief through-holes larger than the outer diameter of connection pins previously formed in the portions not contacting with the connection pins. The negative sheet, the insulating sheet and the positive sheet are laminated in a manner that the relief through-holes of respective sheets are in coincidence. The contact portions to be connected to the connection pins are formed integrally with the negative sheet and positive sheet simultaneously. The contact portions are formed in the through-holes requiring electrical connection with connection pins among the through-holes in which the IC connection pins are fitted.

Figure 1:
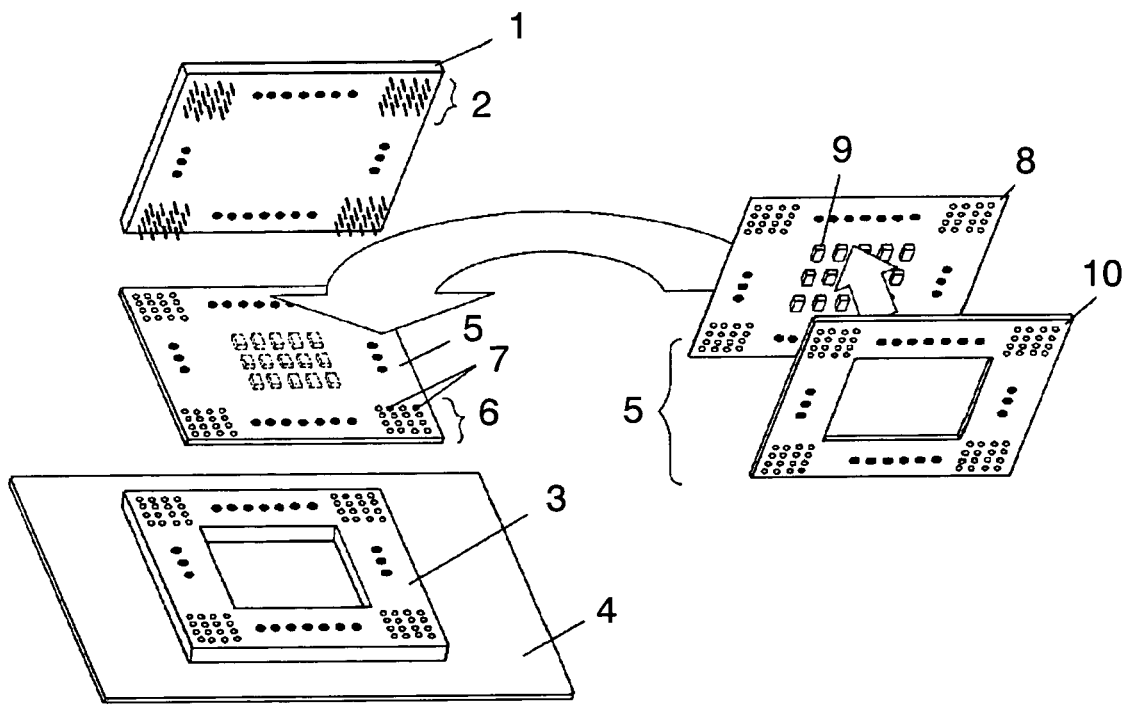
FIG. 1 is a perspective exploded view showing a sheet capacitor in accordance with a first exemplary embodiment of the present invention and a state of its use.

Each of FIG. 3A to FIG. 3D is a plan view showing a configuration of a contact portion in FIG. 1.

Figure 4:
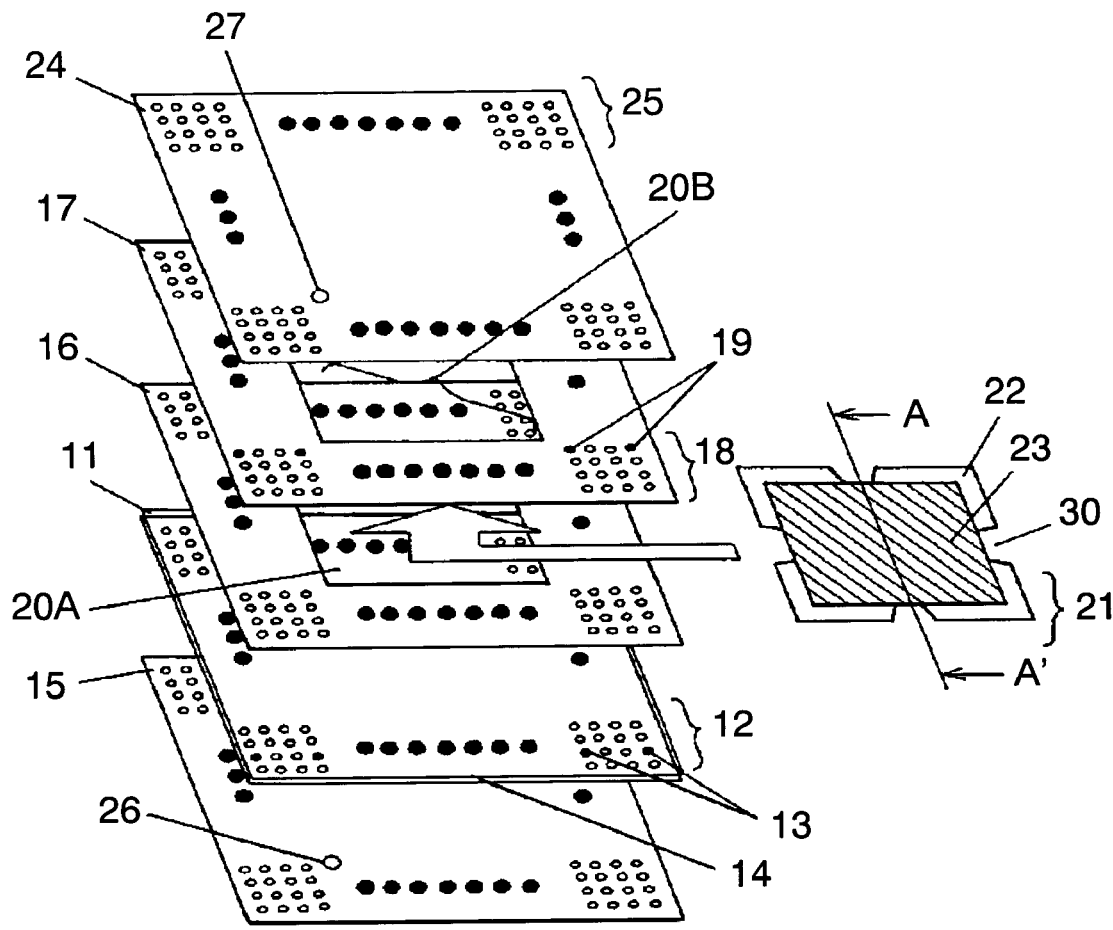

FIG. 4 is a perspective exploded view showing a configuration of a sheet capacitor in accordance with a second exemplary embodiment of the present invention.

Figure 5:
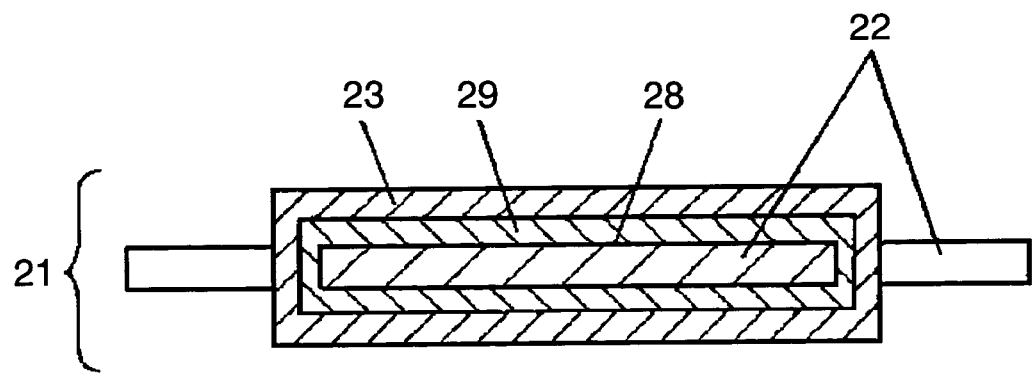

FIG. 5 is a sectional view of a capacitor element used in the sheet capacitor in FIG. 4.

Figure 6:
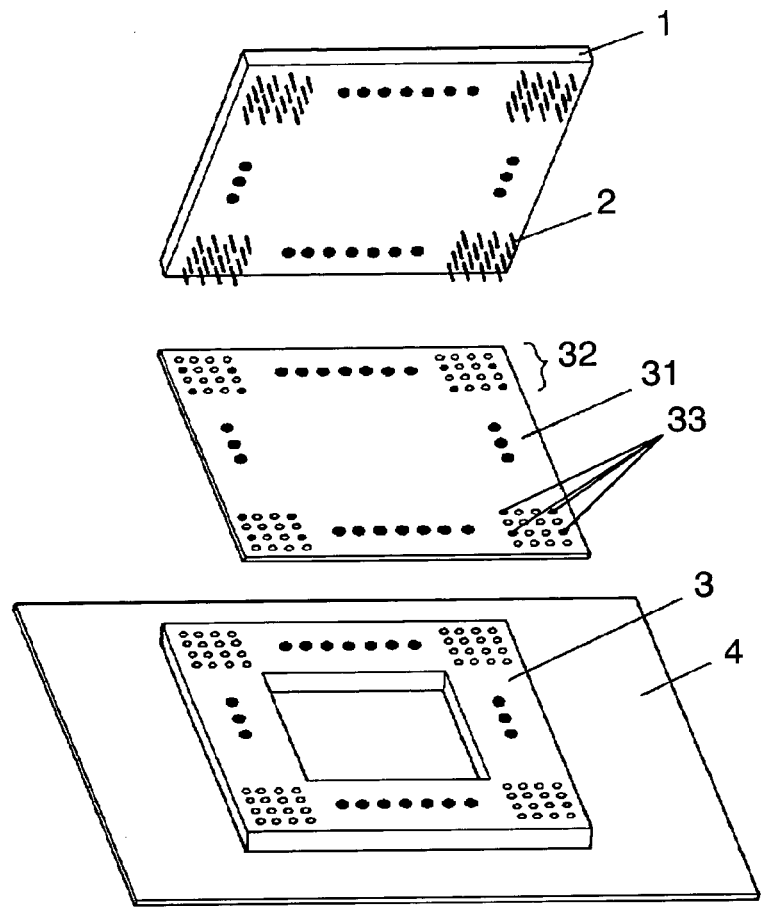

FIG. 6 is a perspective exploded view showing a state of use of the sheet capacitor in FIG. 4.

Figure 7:
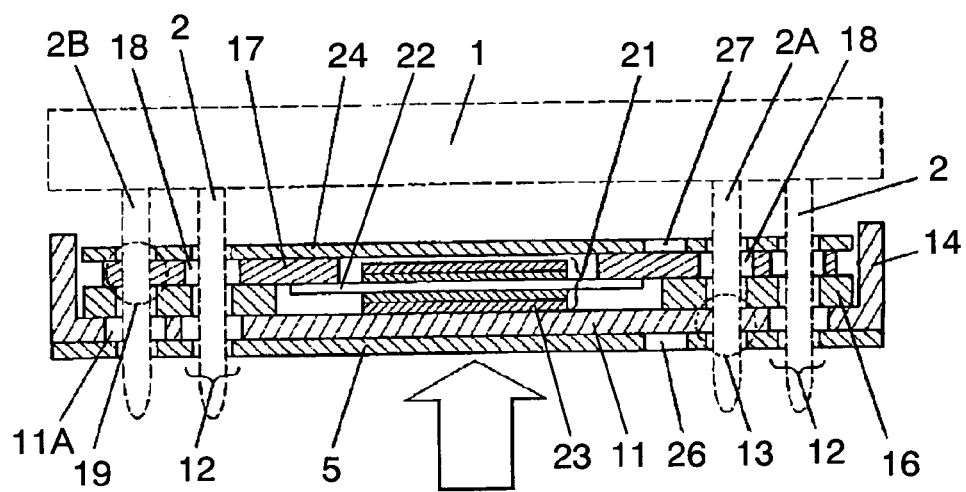

FIG. 7 is a sectional view showing a state of connection of an IC to the sheet capacitor in FIG. 4.

Figure 8:
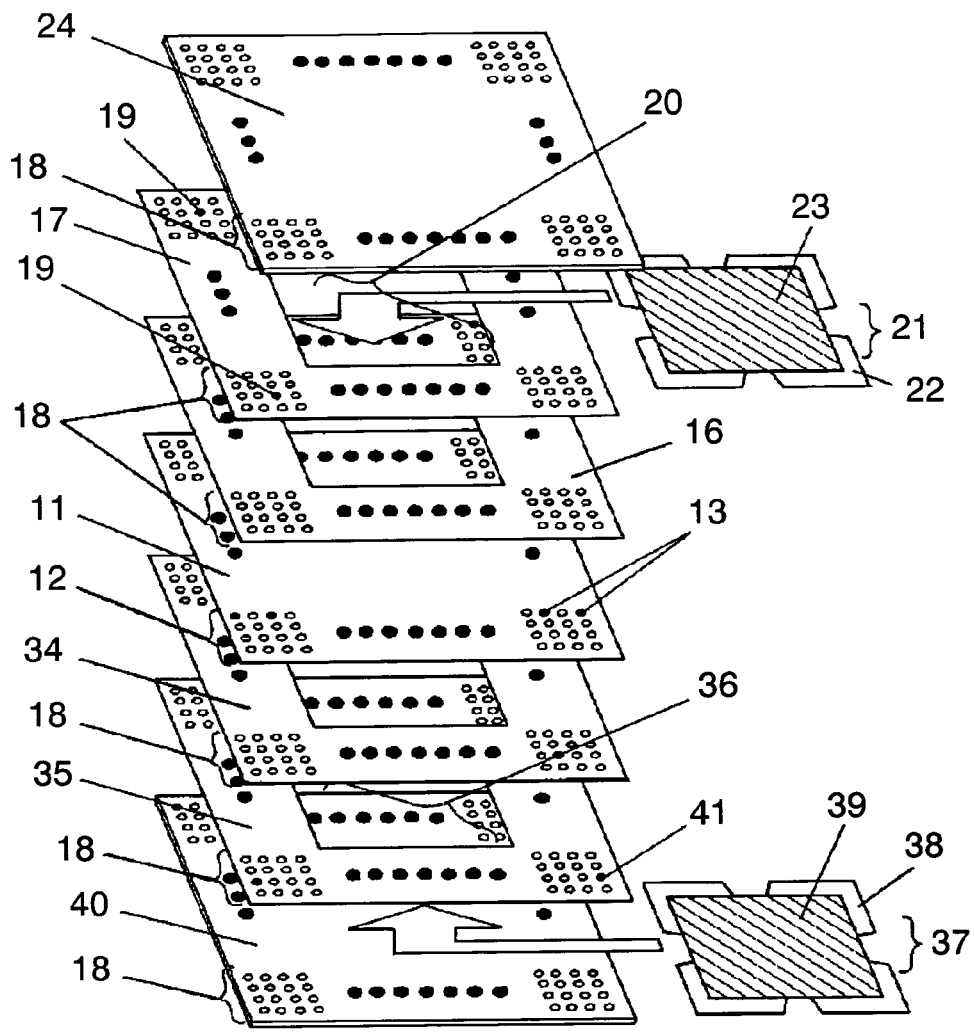

FIG. 8 is a perspective exploded view showing a configuration of a sheet capacitor in accordance with a third exemplary embodiment of the present invention.

Figure 9:
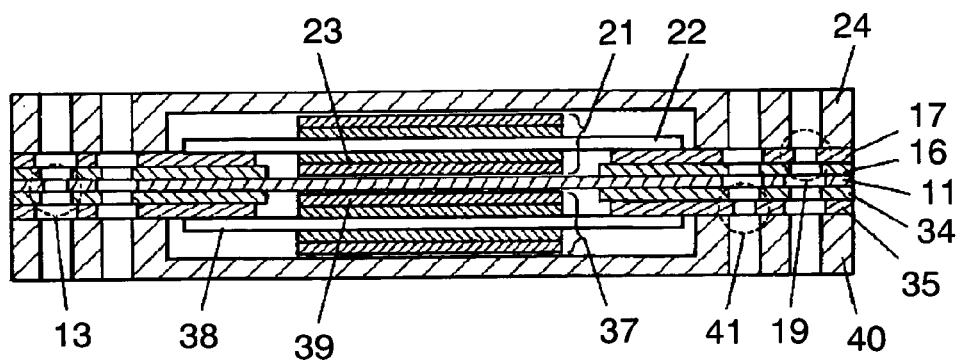

FIG. 9 is a sectional view of the sheet capacitor in FIG. 8.

Figure 10:
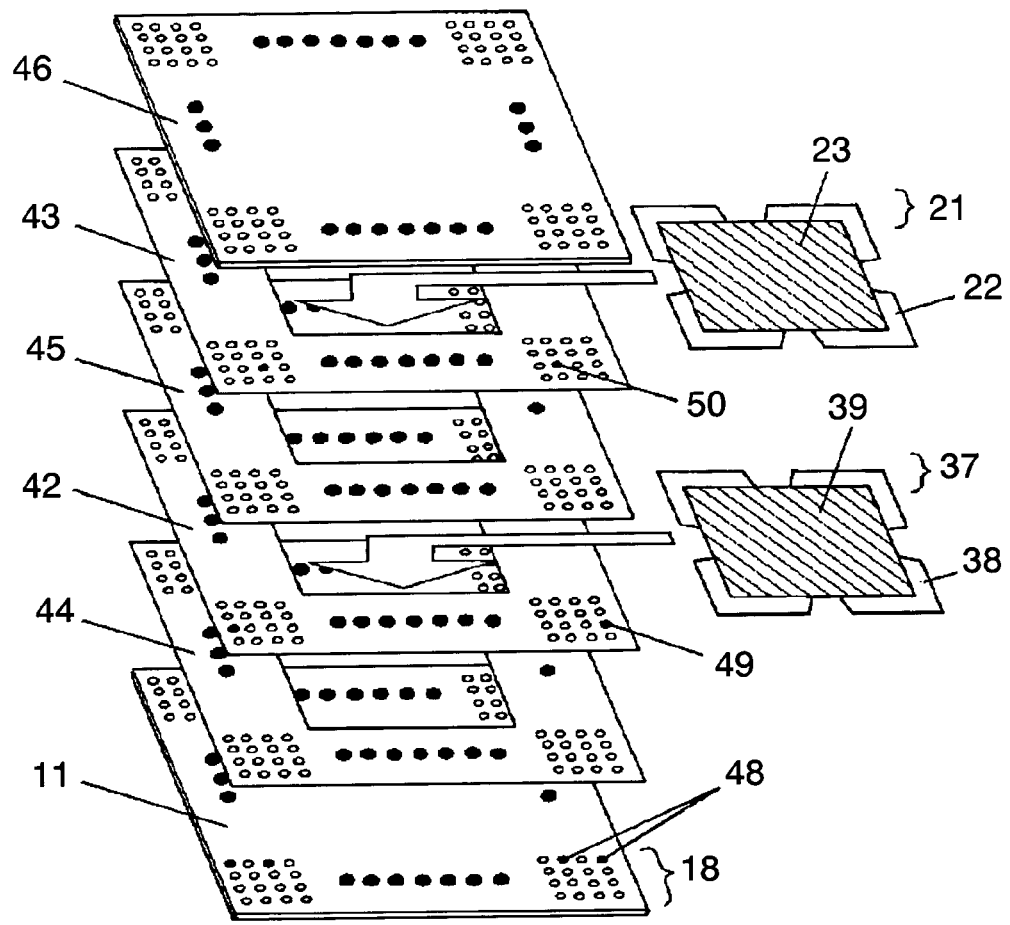

FIG. 10 is a perspective exploded view showing a configuration of a sheet capacitor in accordance with a fourth exemplary embodiment of the present invention.

Figure 11:
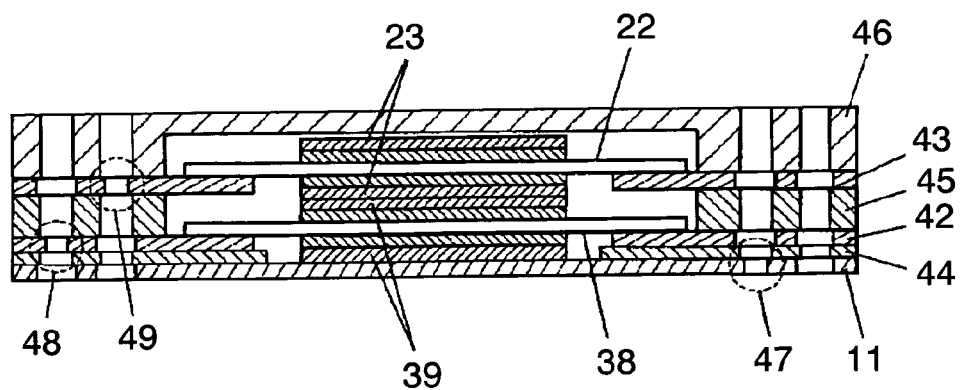

FIG. 11 is a sectional view of the sheet capacitor in FIG. 10.

Figure 12:
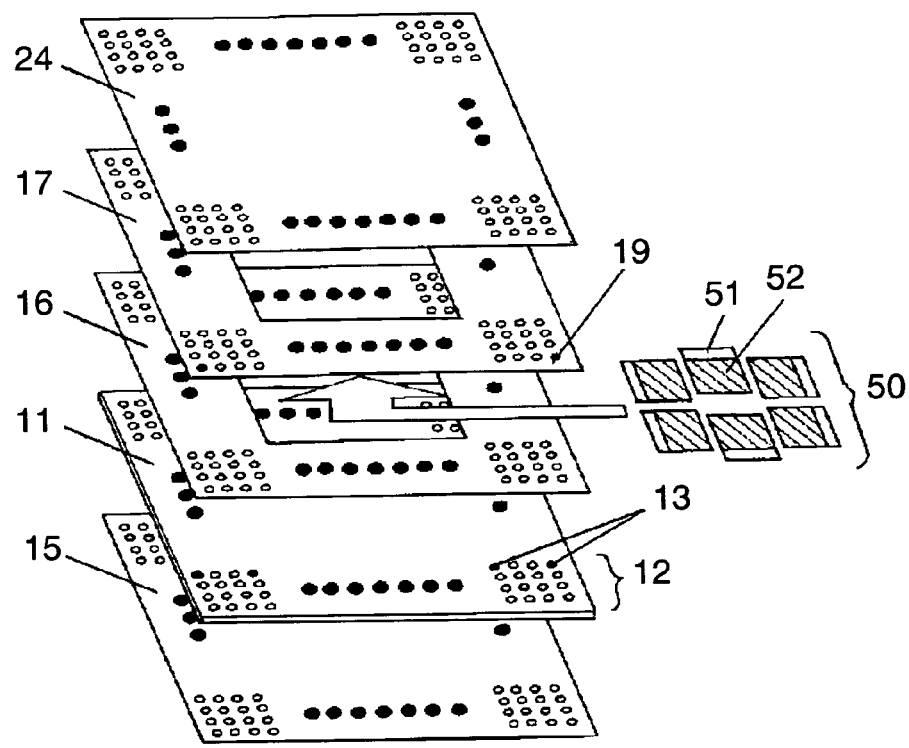

FIG. 12 is a perspective exploded view showing a configuration of a sheet capacitor in accordance with a fifth exemplary embodiment of the present invention.

Figure 13:
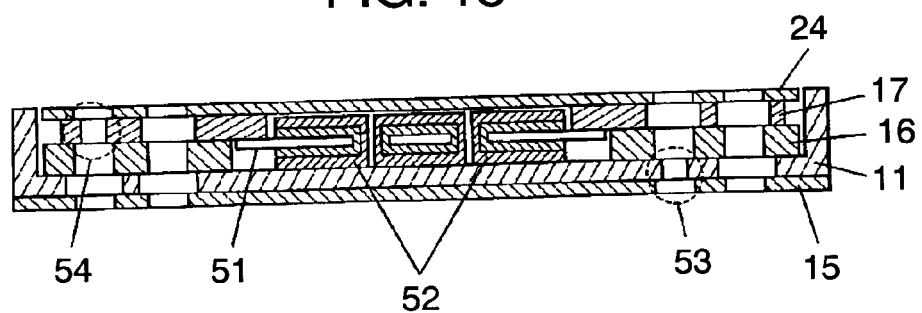

FIG. 13 is a sectional view of the sheet capacitor in FIG. 12.

Figure 14:
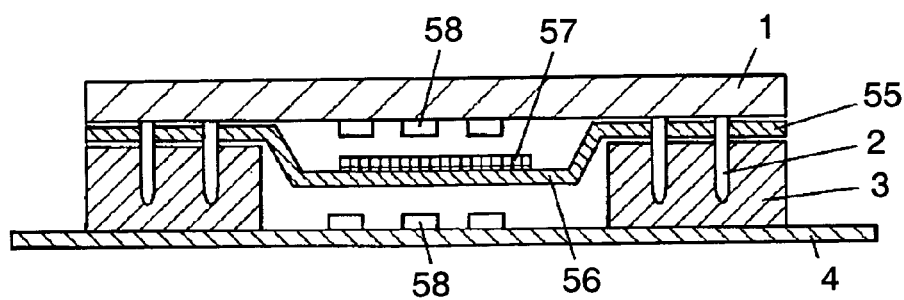

FIG. 14 is a sectional view showing a sheet capacitor in accordance with a sixth exemplary embodiment of the present invention and a state of its use.

Figure 15:
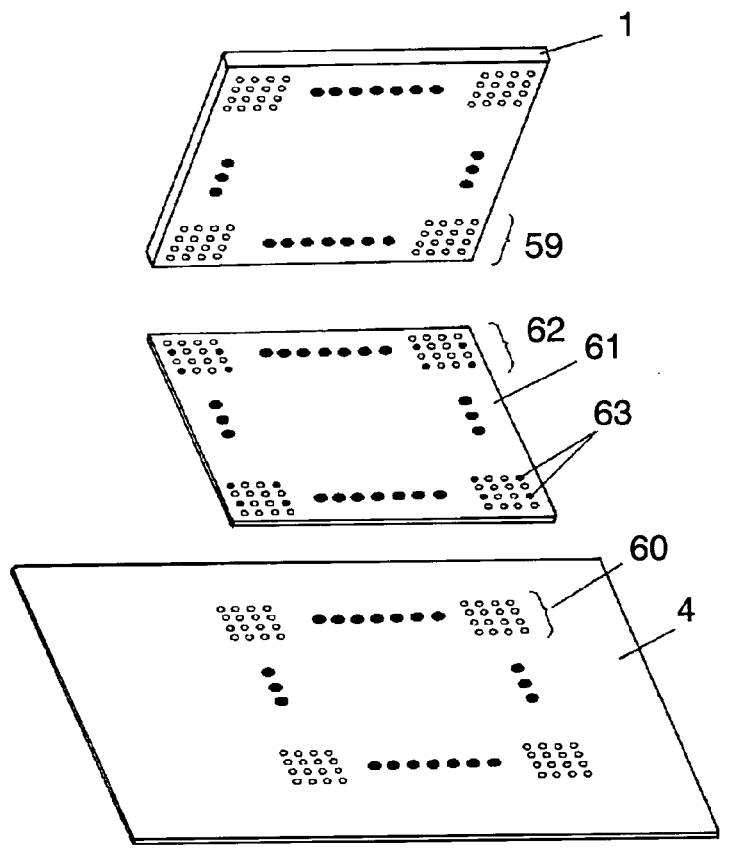

FIG. 15 is a perspective exploded view showing a sheet capacitor in accordance with a seventh exemplary embodiment of the present invention and a state of its use.

Figure 16:
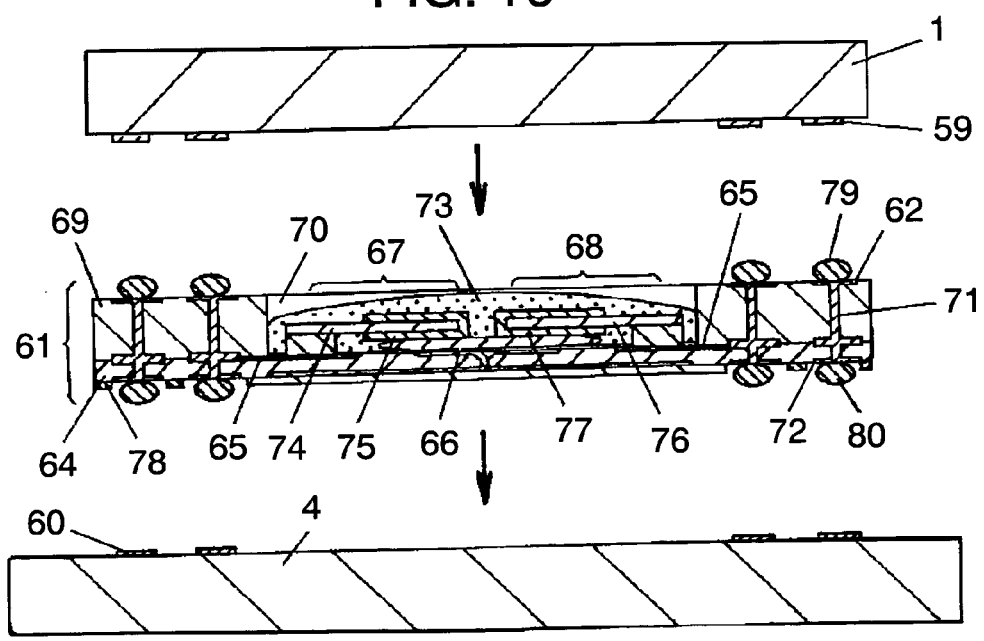

FIG. 16 is a sectional view of the sheet capacitor in FIG. 15 and its periphery.

Figure 17:
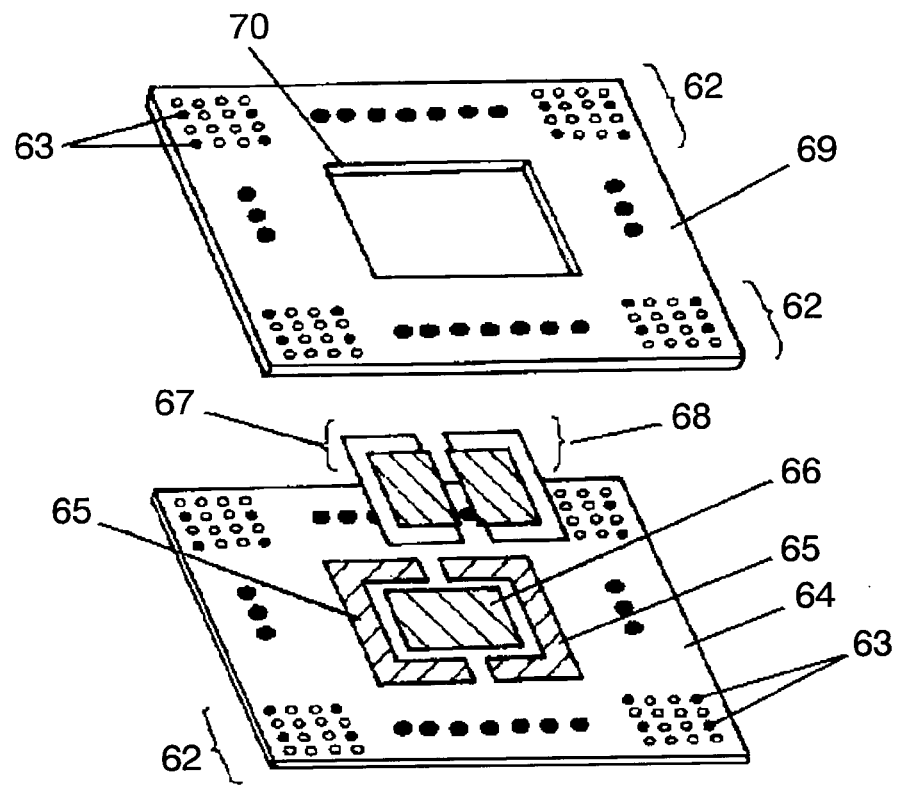

FIG. 17 is a perspective exploded view showing a configuration of the sheet capacitor in FIG. 15.

Figure 18:
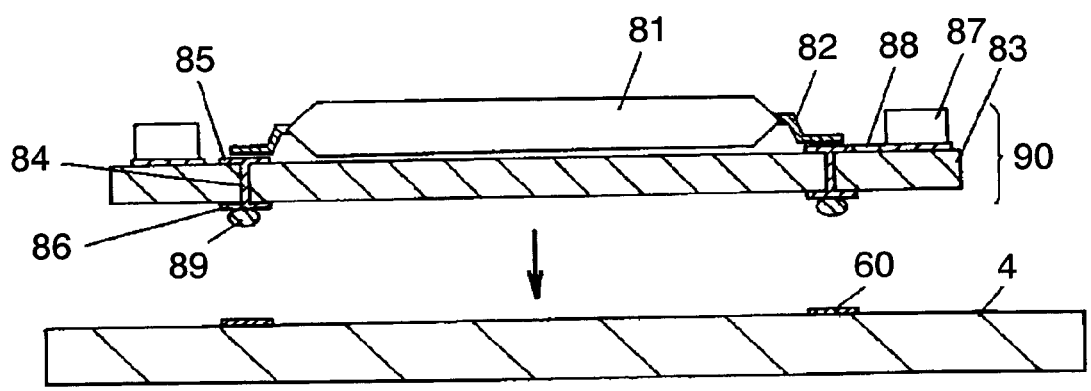

FIG. 18 is a sectional view showing a configuration of a sheet capacitor in accordance with an eighth exemplary embodiment of the present invention.

Figure 19:
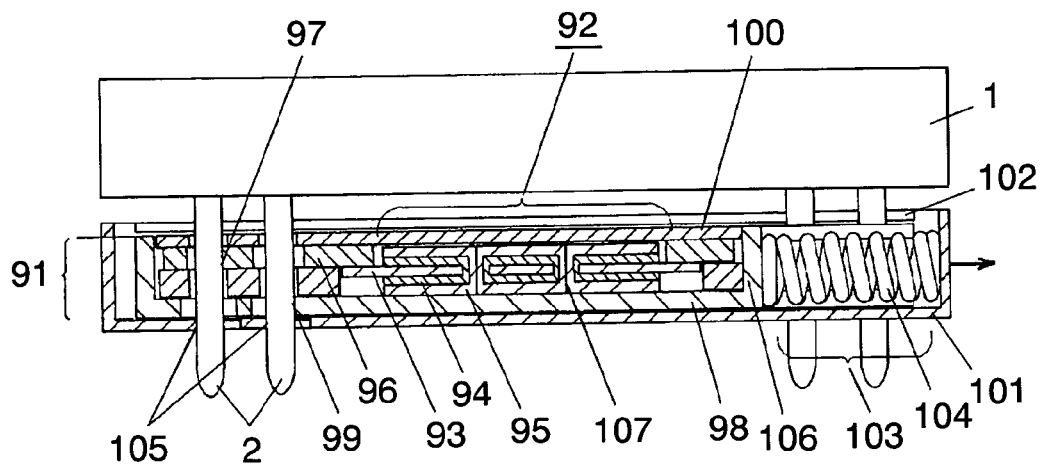

FIG. 19 is a sectional view showing a configuration of a sheet capacitor in accordance with a ninth exemplary embodiment of the present invention.

Figure 20:
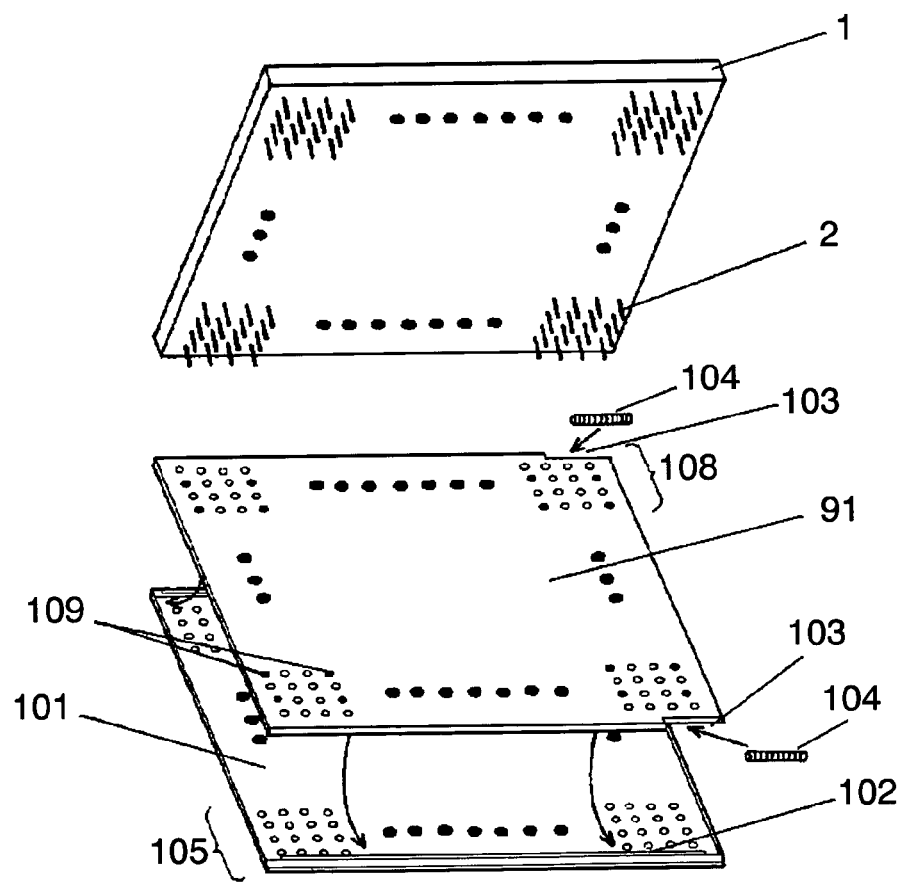

FIG. 20 is a perspective exploded view of the sheet capacitor in FIG. 19.

Figure 21A:
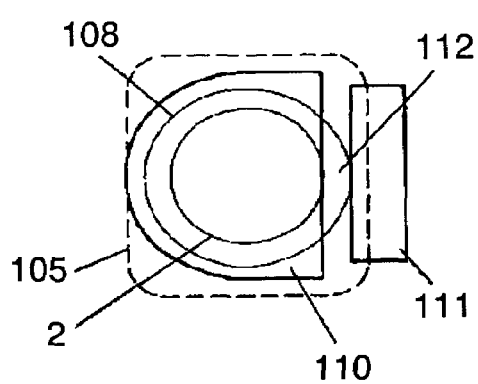
Figure 21B:
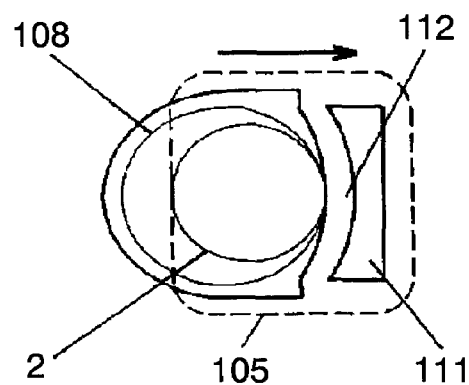

FIG. 21A and FIG. 21B are plan views showing a configuration of a contact portion of a sheet capacitor in accordance with a tenth exemplary embodiment of the present invention.

Figure 22A:
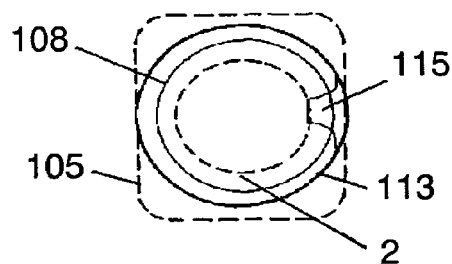
Figure 22B:
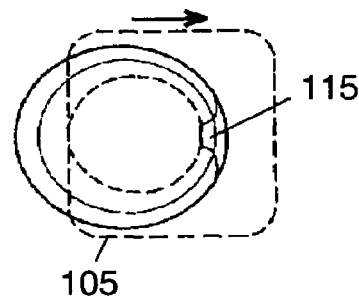

FIG. 22A and FIG. 22B are plan views showing another example of a contact portion of a sheet capacitor in accordance with the tenth exemplary embodiment of the present invention.

Figure 22C:
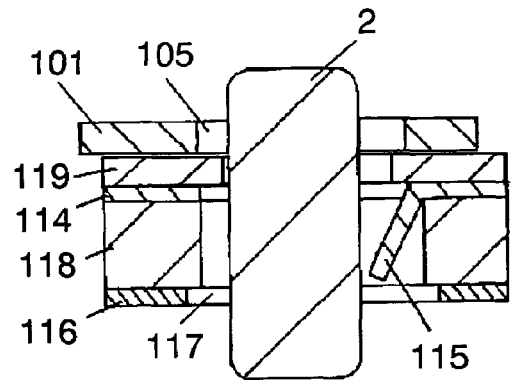
Figure 22D:
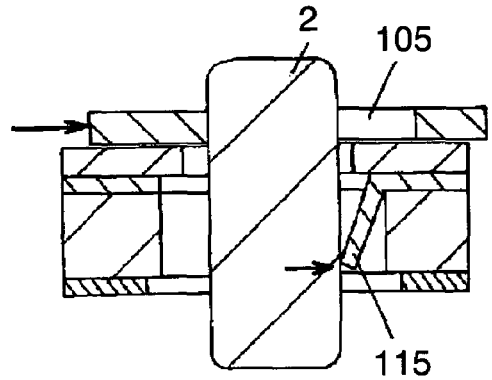

FIG. 22C and FIG. 22D are sectional views of FIG. 22A and FIG. 22B, respectively.

Figure 23:
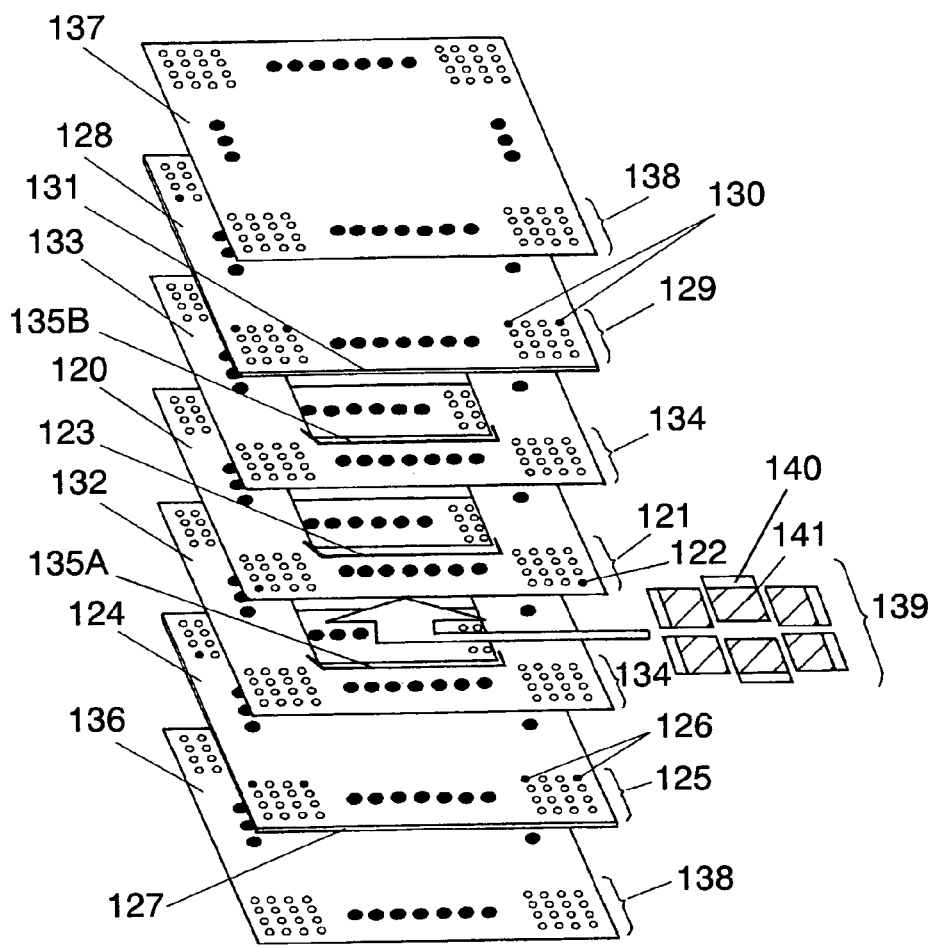

FIG. 23 is a perspective exploded view showing a configuration of a sheet capacitor in accordance with an eleventh exemplary embodiment of the present invention.

Figure 24:
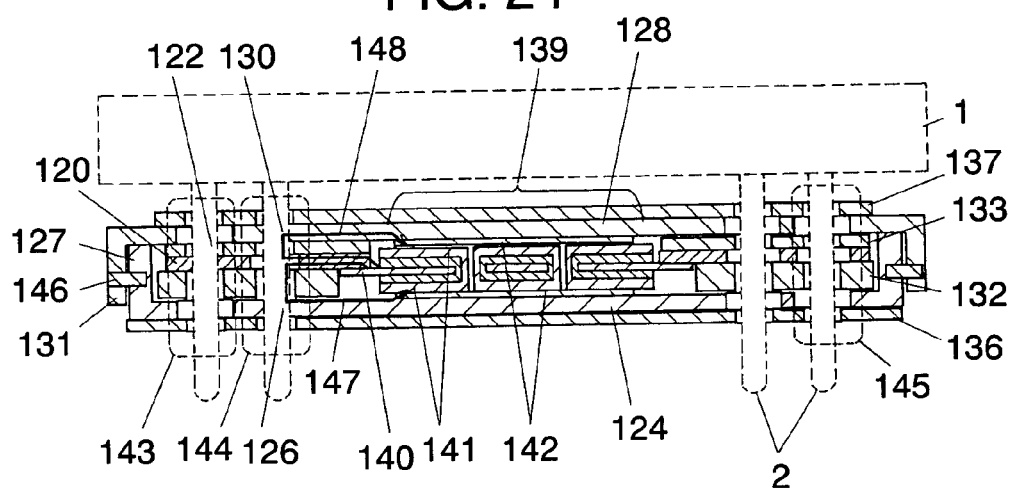

FIG. 24 is a sectional view showing a state of connection of an IC to the sheet capacitor in FIG. 23.

Figure 25A:
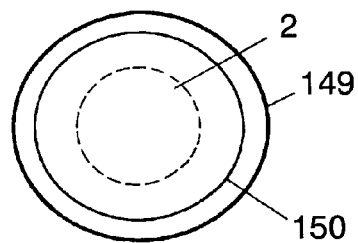

FIG. 25A is a plan view showing a through-hole not contacting with a connection pin of an IC provided on the sheet capacitor in FIG. 23.

Figure 25B:
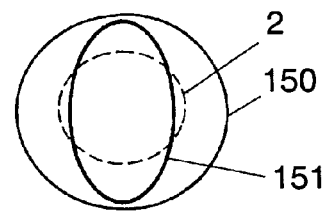

FIG. 25B is a plan view showing a contact portion of the sheet capacitor in FIG. 23.

Figure 26:
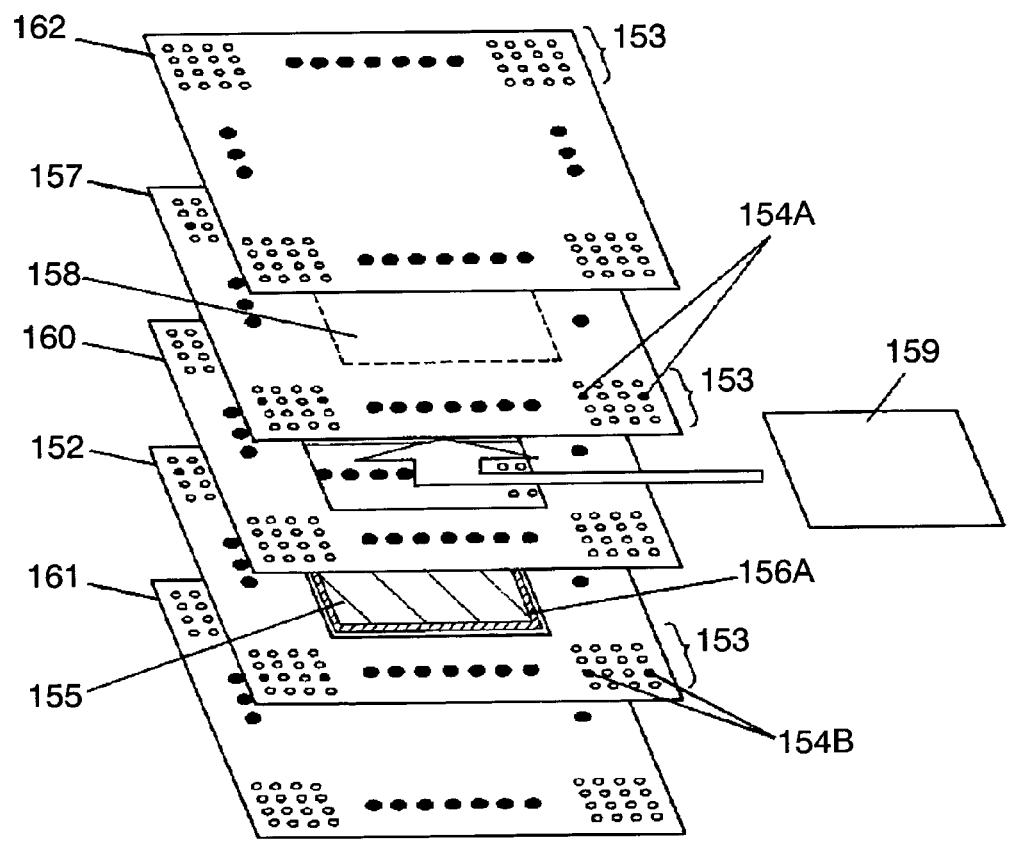

FIG. 26 is a perspective exploded view showing a configuration of a sheet capacitor in accordance with a twelfth exemplary embodiment of the present invention.

Figure 27:
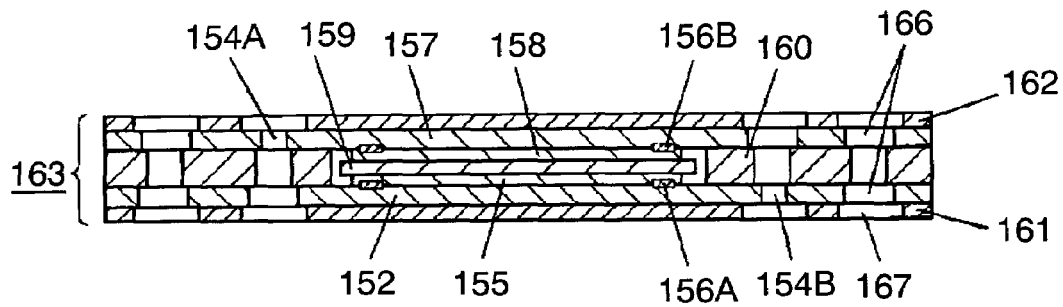

FIG. 27 is a sectional view of the sheet capacitor in FIG. 26.

Figure 28:
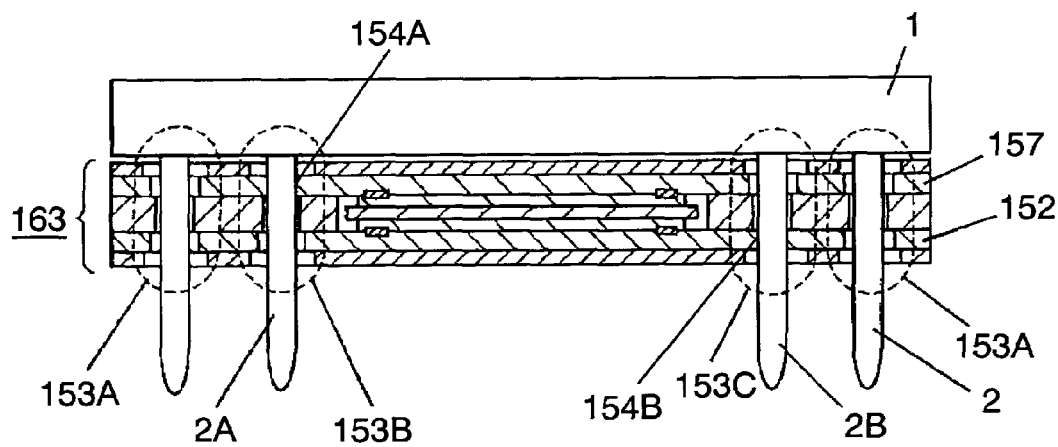

FIG. 28 is a sectional view showing a state of connection of an IC to the sheet capacitor in FIG. 26.

Figure 29:
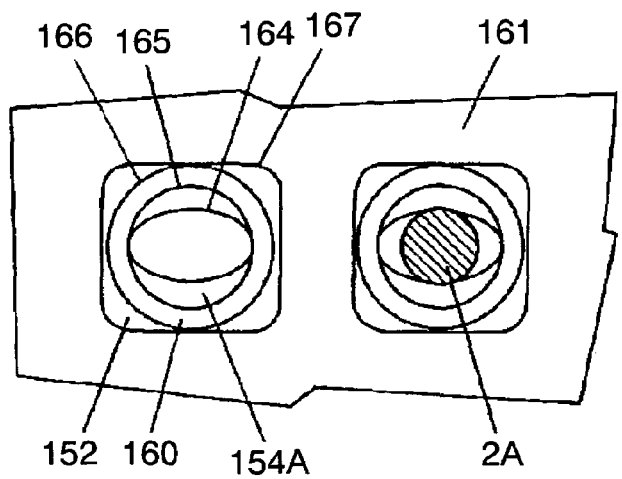

FIG. 29 is a plan view showing a configuration of a contact portion of the sheet capacitor in FIG. 27.

Figure 30:
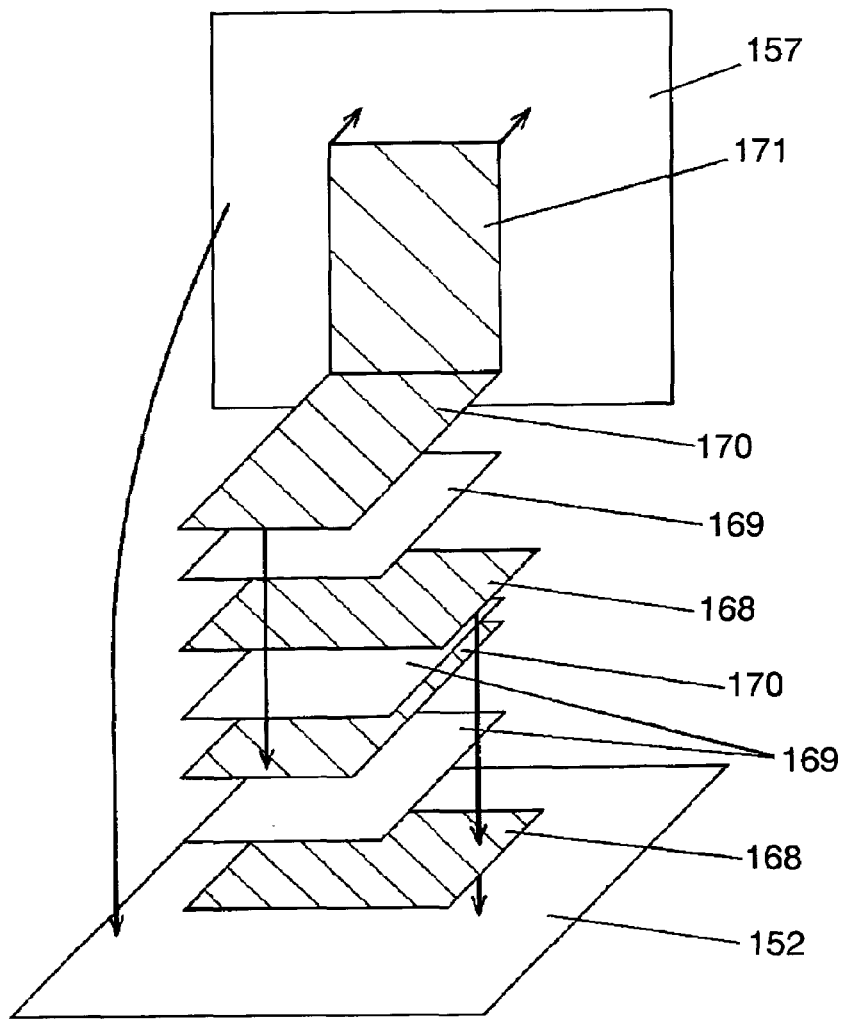

FIG. 30 is a perspective exploded view showing a configuration of lamination of a plurality of electrode foils of the sheet capacitor in FIG. 26.

Figure 31:
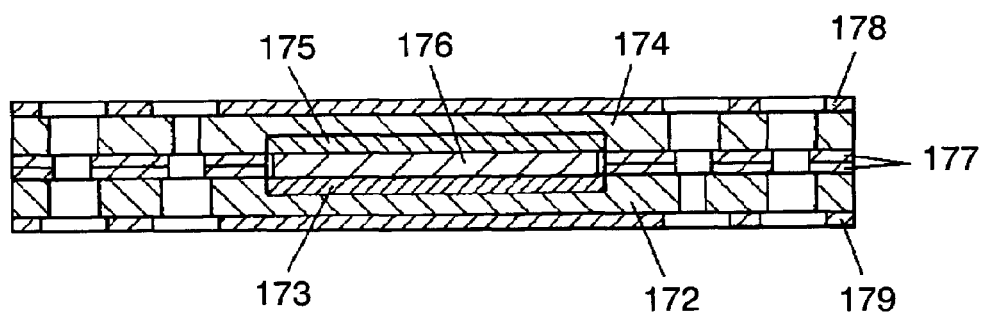

FIG. 31 is a sectional view showing a configuration of a sheet capacitor in accordance with a thirteenth exemplary embodiment of the present invention.

Figure 32:
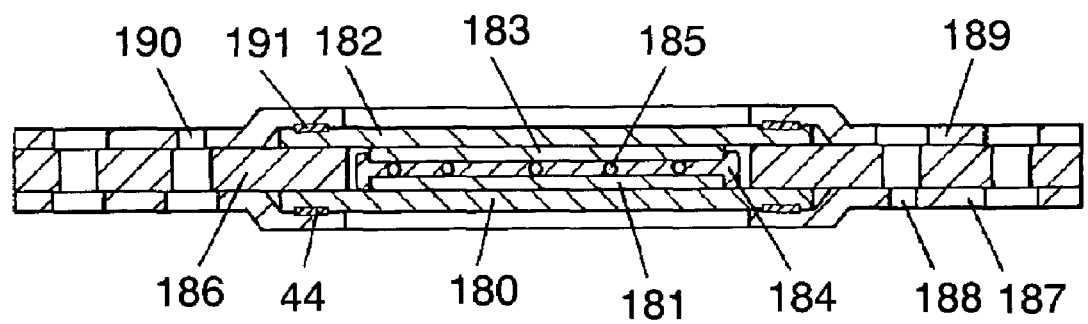

FIG. 32 is a sectional view showing a configuration of sheet capacitor in accordance with a fourteenth exemplary embodiment of the present invention.

Figure 33:
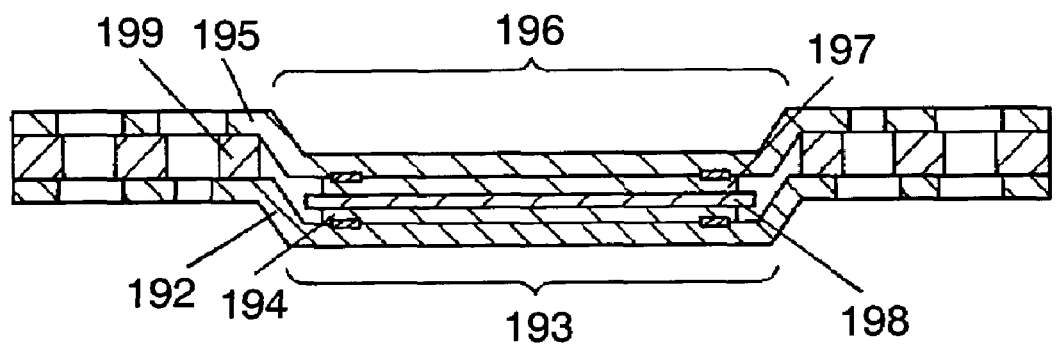

FIG. 33 is a sectional view showing a configuration of a sheet capacitor in accordance with a fifteenth exemplary embodiment of the present invention.

Figure 34:
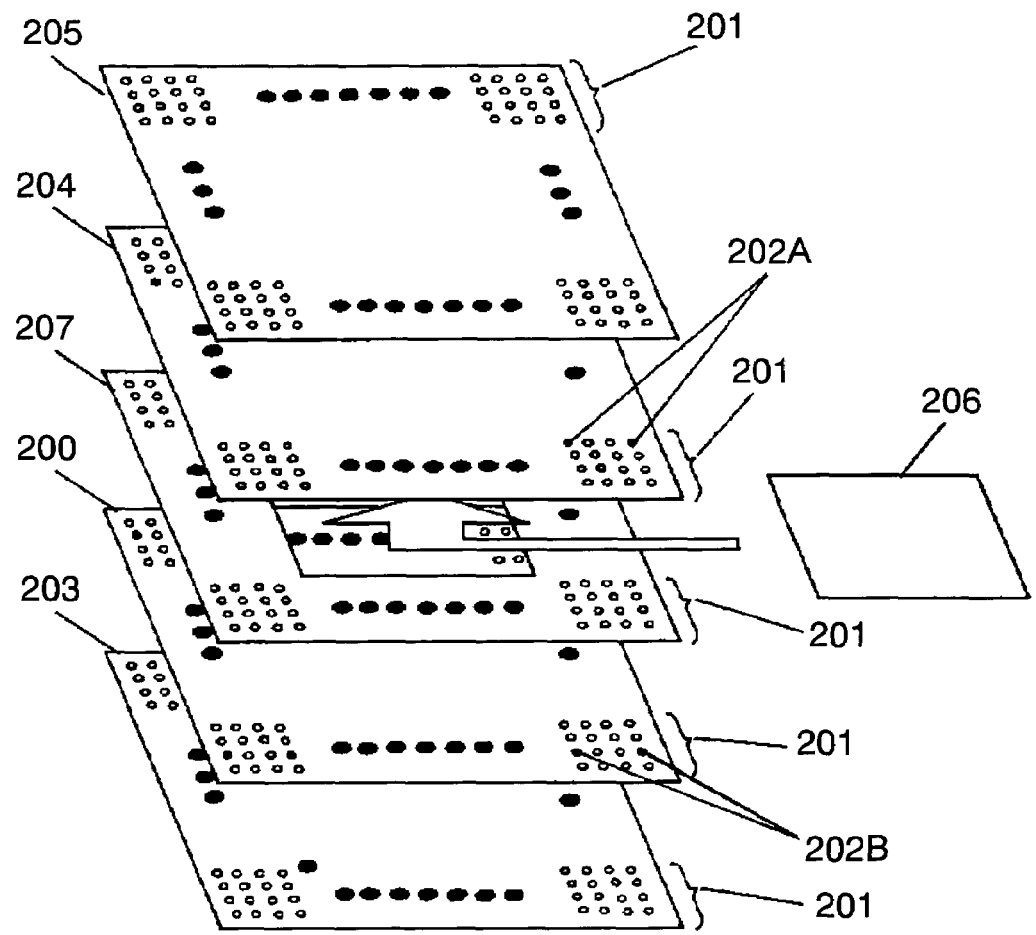

FIG. 34 is a sectional view showing a configuration of a sheet capacitor in accordance with a sixteenth exemplary embodiment of the present invention.

Figure 35:
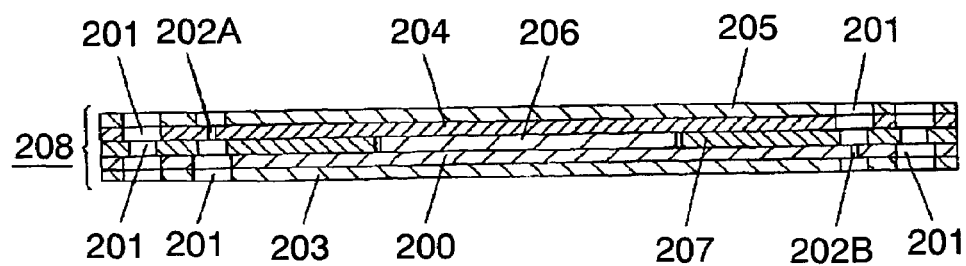

FIG. 35 is a sectional view of the sheet capacitor in FIG. 34.

Figure 36:
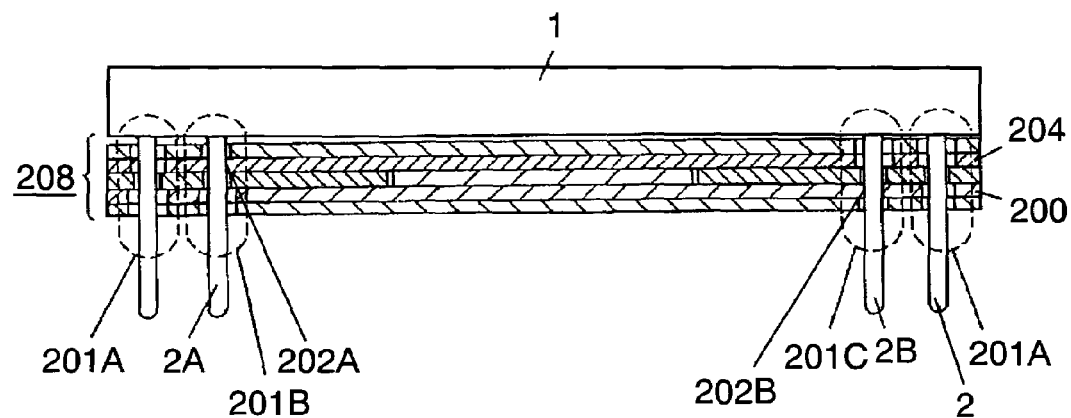

FIG. 36 is a sectional view showing a state of connection of an IC to the sheet capacitor in FIG. 34.

Figure 37:
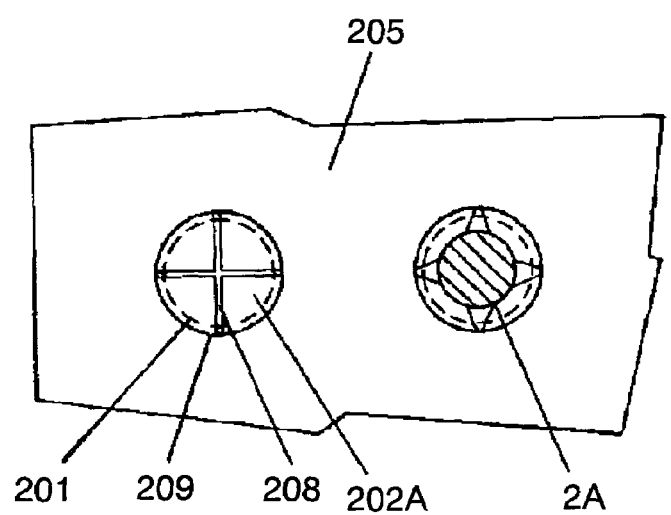

FIG. 37 is a plan view showing a configuration of a contact portion of the sheet capacitor in FIG. 34.

Figure 38:
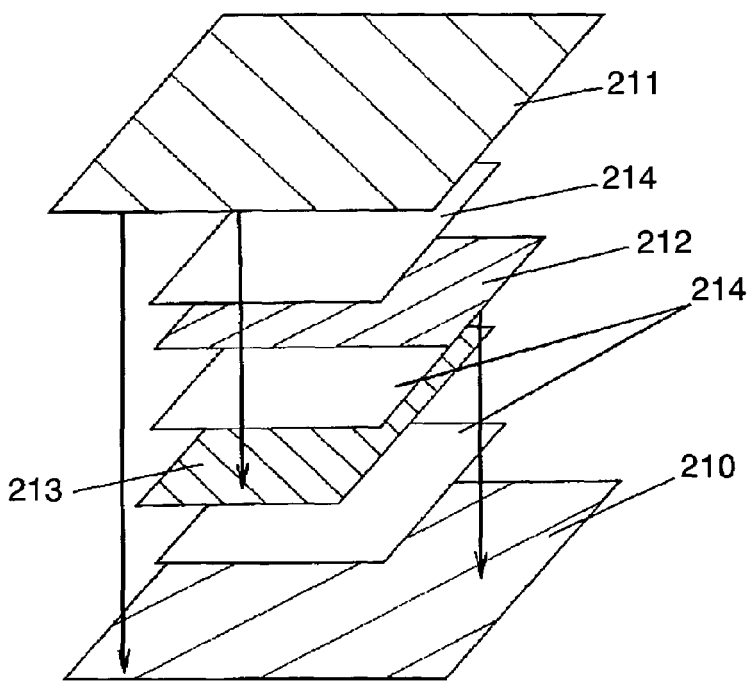

FIG. 38 is a perspective exploded view showing a configuration of lamination of a plurality of electrode foils of the sheet capacitor in FIG. 34.

Figure 39:
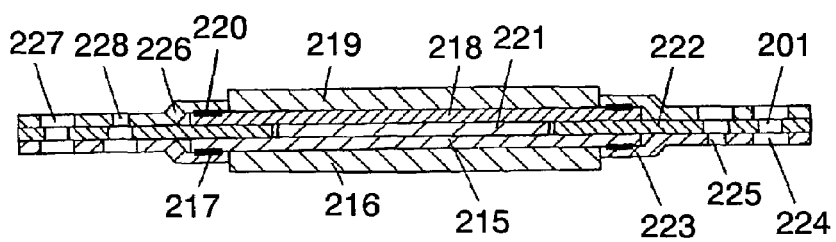

FIG. 39 is a sectional view showing a configuration of a sheet capacitor in accordance with a seventeenth exemplary embodiment of the present invention.

Figure 40:
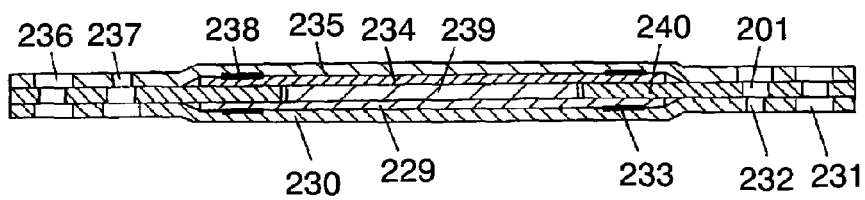

FIG. 40 is a sectional view showing a configuration of a sheet capacitor in accordance with a eighteenth exemplary embodiment of the present invention.

Figure 41:
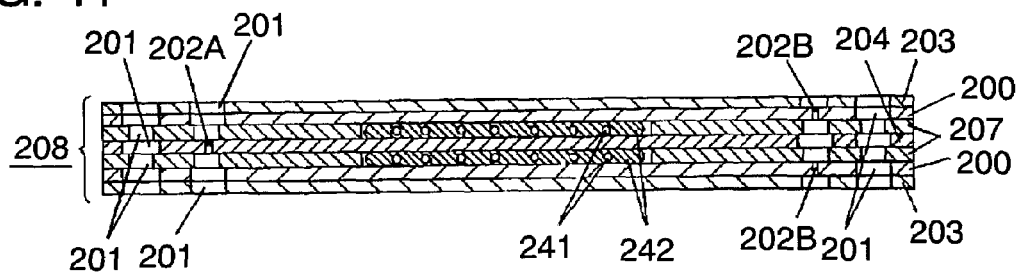

FIG. 41 is a sectional view showing a configuration of a sheet capacitor in accordance with a nineteenth exemplary embodiment of the present invention.

Figure 42:
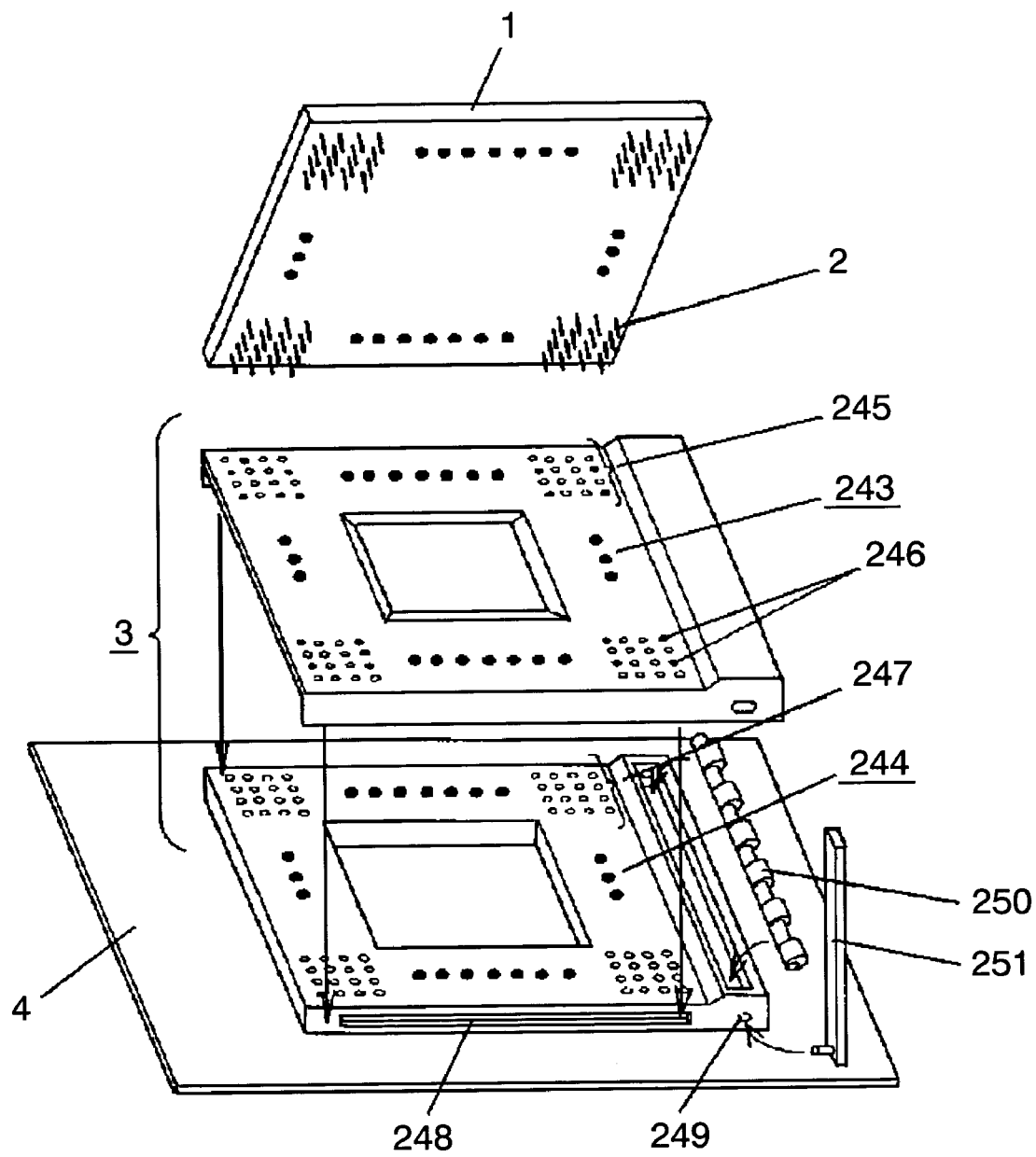

FIG. 42 is a perspective exploded view of an IC socket using a sheet capacitor in accordance with a twentieth exemplary embodiment of the present invention and a state of its use.

Figure 43:
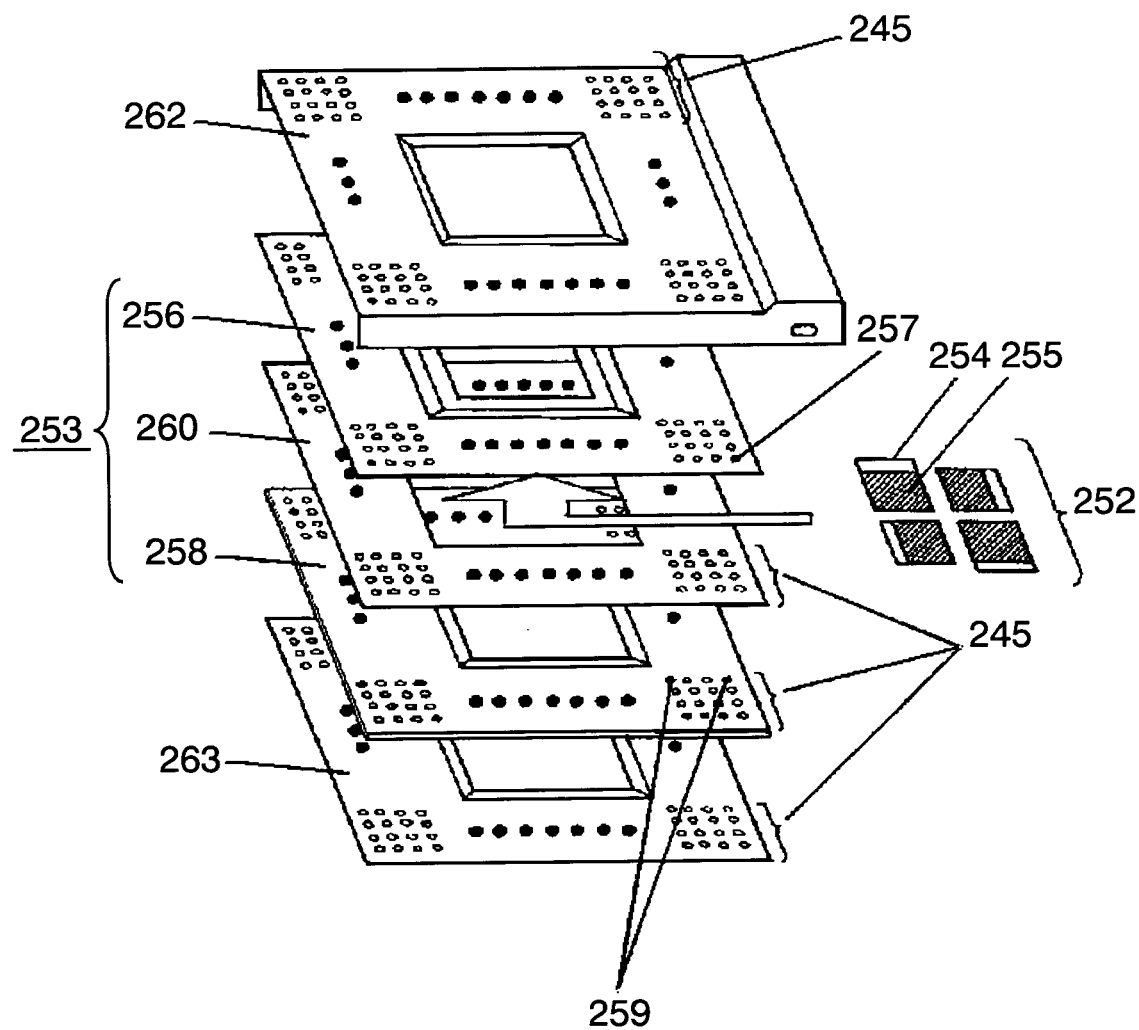

FIG. 43 is a perspective exploded view of a slide portion composing the IC socket in FIG. 42.

Figure 44:
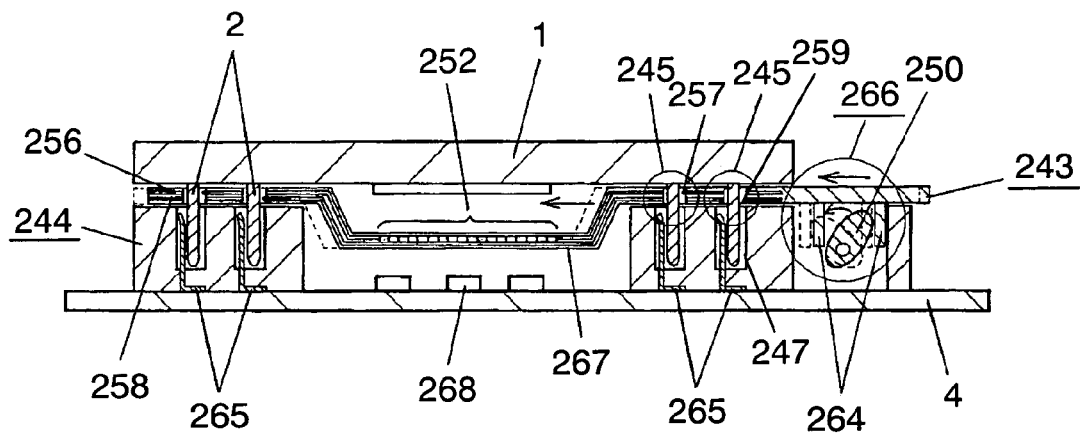

FIG. 44 is a front sectional view of the IC socket in FIG. 42.

Figure 45A:
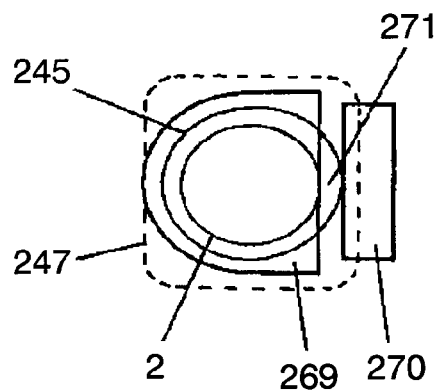
Figure 45B:
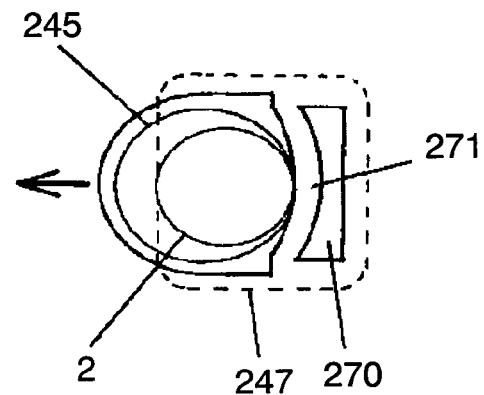

FIG. 45A and FIG. 45B are plan views showing a configuration of a contact portion of an IC socket using a sheet capacitor in accordance with a twenty-first exemplary embodiment of the present invention.

Figure 46A:
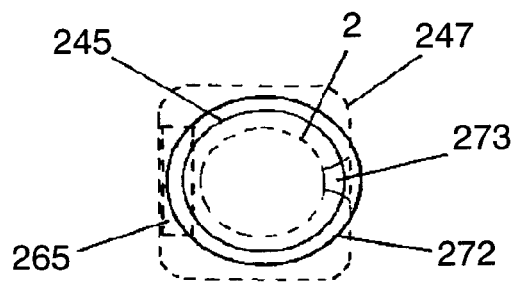
Figure 46B:
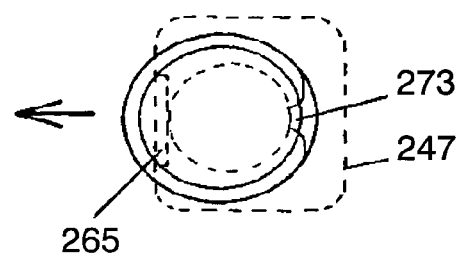

FIG. 46A and FIG. 46B are plan views showing another example of a contact portion of an IC socket in accordance with a twenty-first exemplary embodiment of the present invention.

Figure 46C:
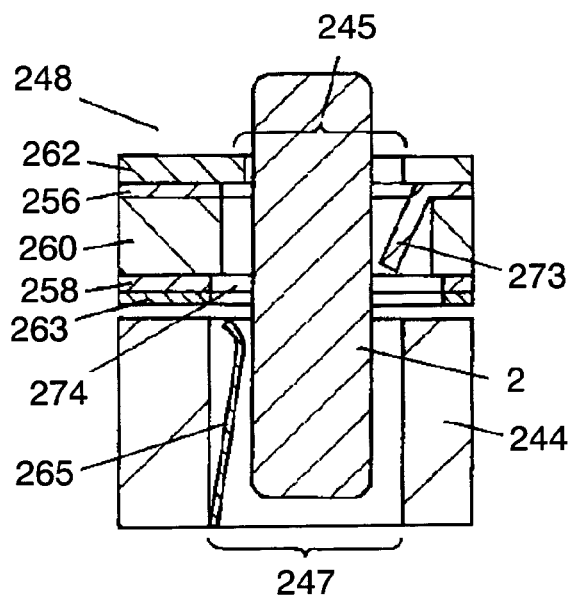
Figure 46D:
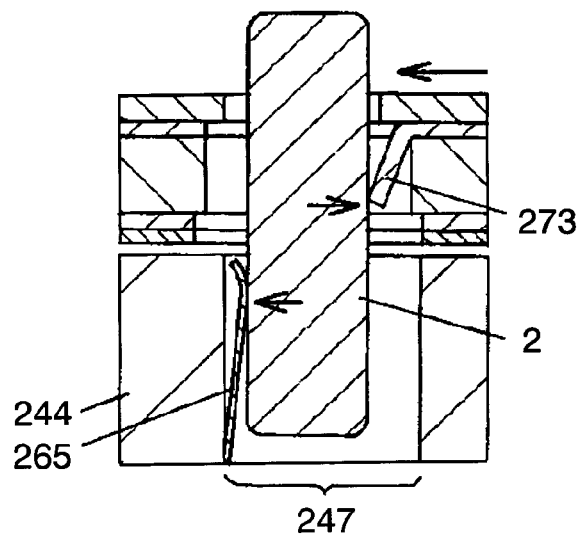

FIG. 46C and FIG. 46D are sectional views of FIG. 46A and FIG. 46B, respectively.

Figure 47A:
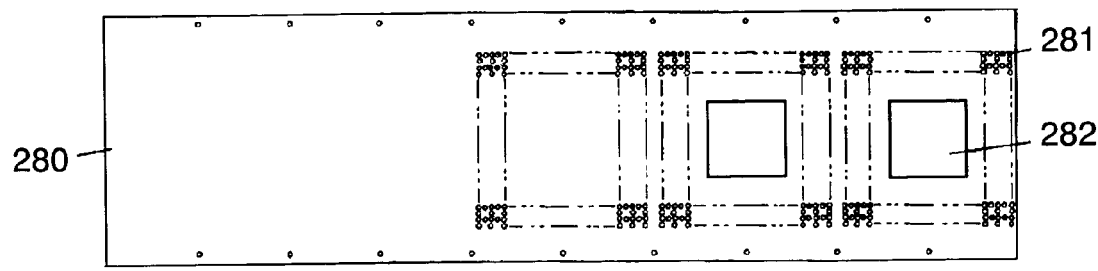

FIG. 47A is a manufacturing process diagram of a positive sheet showing stages from a raw material stage up to a press forming process in a manufacturing method of a sheet capacitor in accordance with a twenty-second exemplary embodiment of the present invention.

Figure 47B:
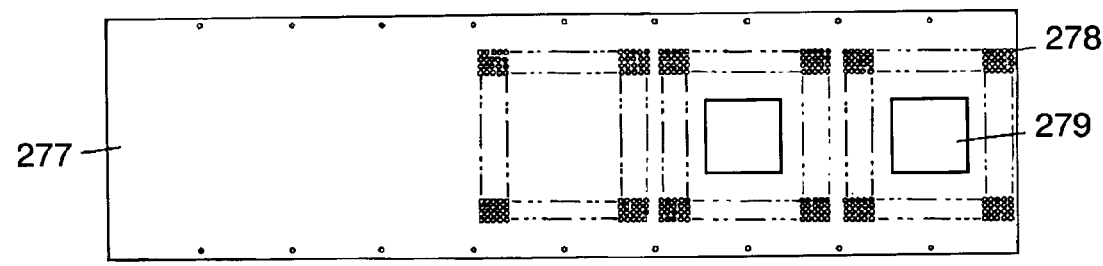

FIG. 47B is a manufacturing process diagram of an insulating sheet of the sheet capacitor in accordance with a twenty-second exemplary embodiment of the present invention.

Figure 47C:
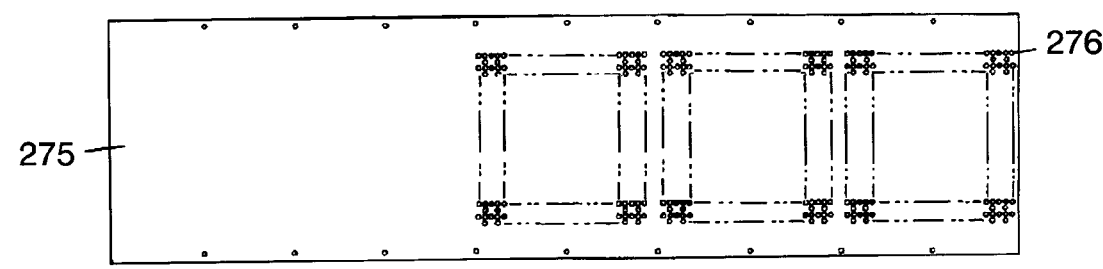

FIG. 47C is a manufacturing process diagram of a negative sheet of the sheet capacitor in accordance with a twenty-second exemplary embodiment of the present invention.

Figure 48A:
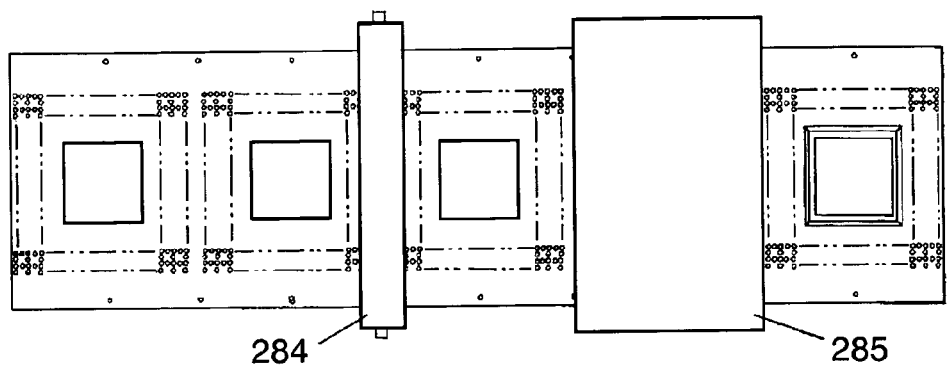

FIG. 48A is a manufacturing process diagram showing a plan view from gluing of the processed negative sheet, the insulating sheet and the positive sheet up to a recess forming process in a manufacturing method of the sheet capacitor in accordance with a twenty-second exemplary embodiment of the present invention.

Figure 48B:
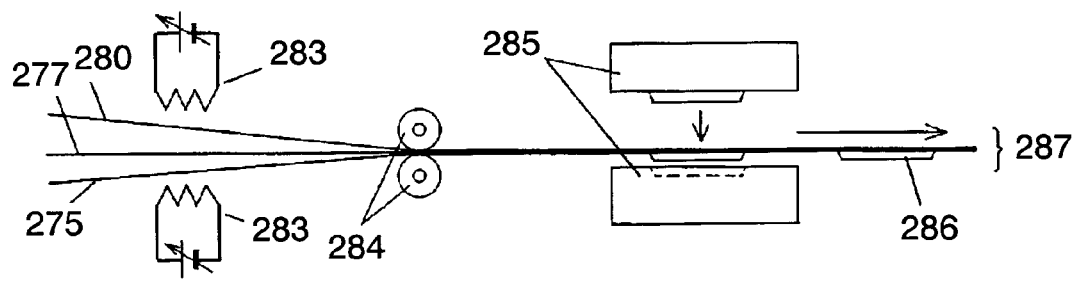

FIG. 48B is a manufacturing process diagram showing a front view of FIG. 48A.

Figure 48C:
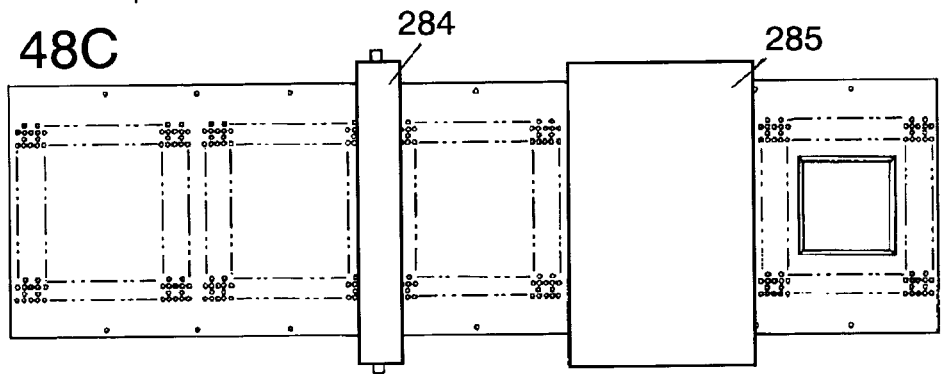

FIG. 48C is a manufacturing process diagram showing a bottom view of FIG. 48A.

Figure 49A:
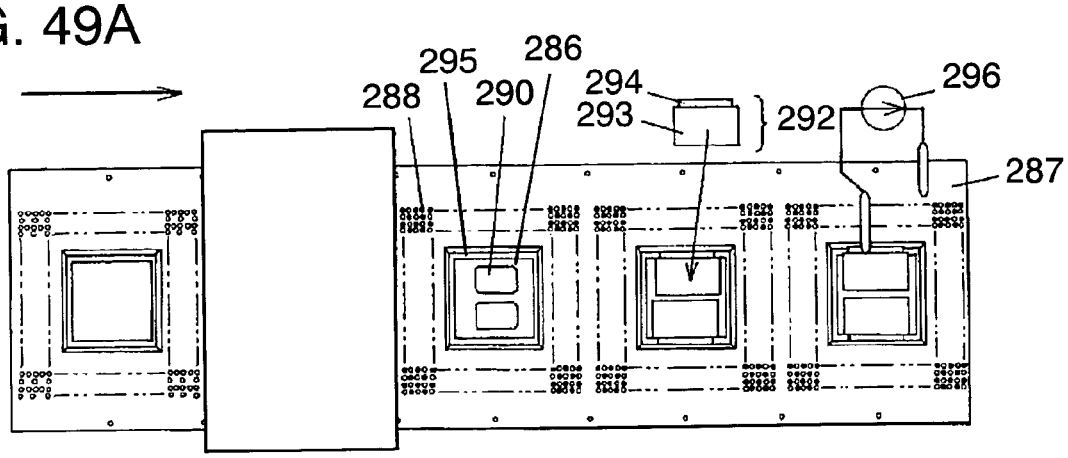

FIG. 49A is a manufacturing process diagram showing a plan view from forming of contact portions in the processed wiring laminate sheet up to a capacitor element mounting process in a manufacturing method of the sheet capacitor in accordance with a twenty-second exemplary embodiment of the present invention.

Figure 49B:
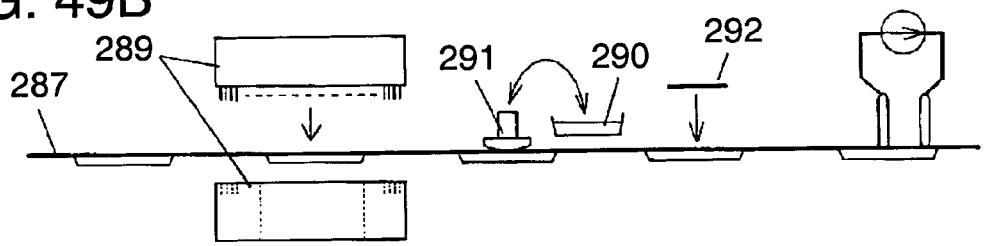

FIG. 49B is a manufacturing process diagram showing a front view of FIG. 49A.

Figure 49C:
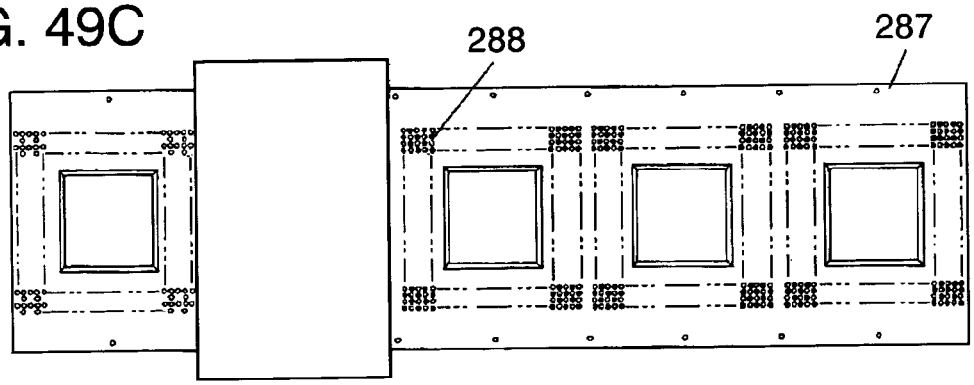

FIG. 49C is a manufacturing process diagram showing a bottom view of FIG. 49A.

Figure 50:
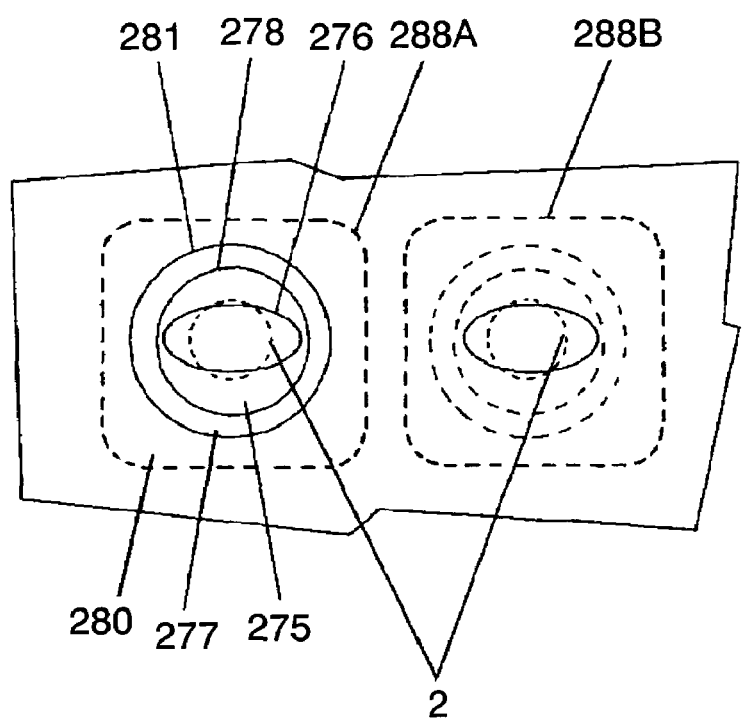

FIG. 50 is a plan view showing contact portions of the sheet capacitor in accordance with a twenty-second exemplary embodiment of the present invention.

Figure 51:
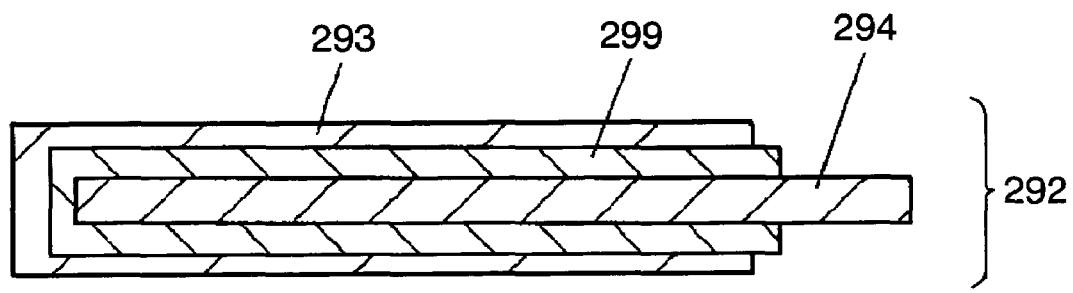

FIG. 51 is a sectional view showing the composition of a capacitor element of the sheet capacitor in accordance with a twenty-second exemplary embodiment of the present invention.

Figure 52A:
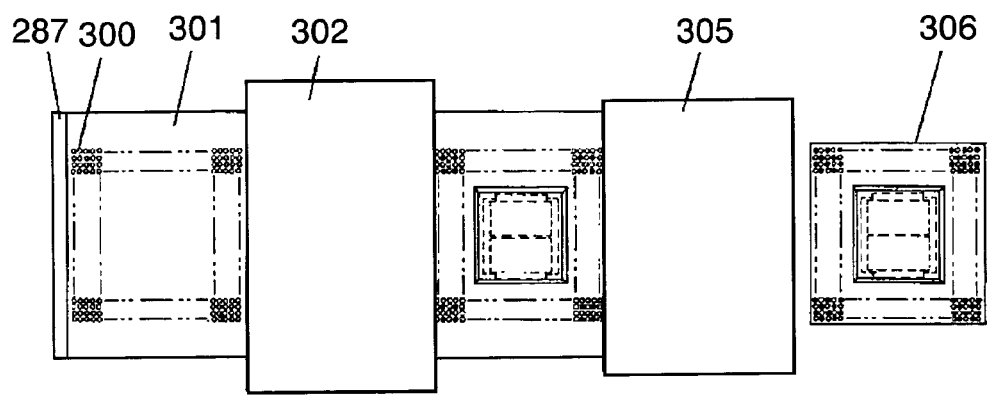

FIG. 52A is a manufacturing process diagram showing a plan view from a gluing process of a cover sheet to protect the capacitor element mounted on the processed wiring laminate sheet up to a process of cutting out a final piece in a manufacturing method of the sheet capacitor in accordance with a twenty-second exemplary embodiment of the present invention.

Figure 52B:
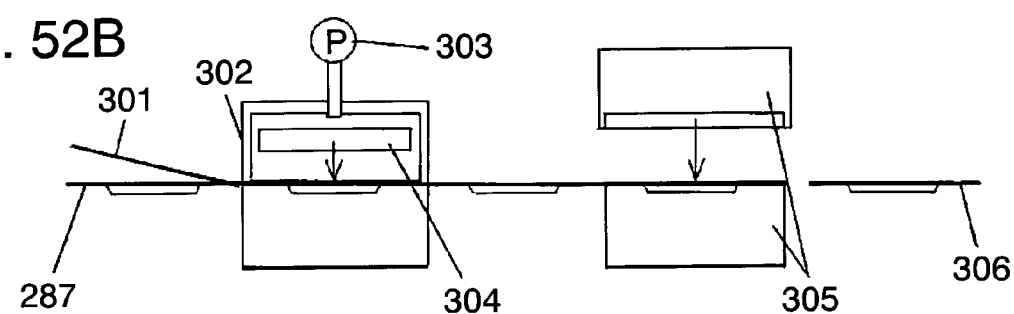

FIG. 52B is a manufacturing process diagram showing a front view of FIG. 52A.

Figure 53:
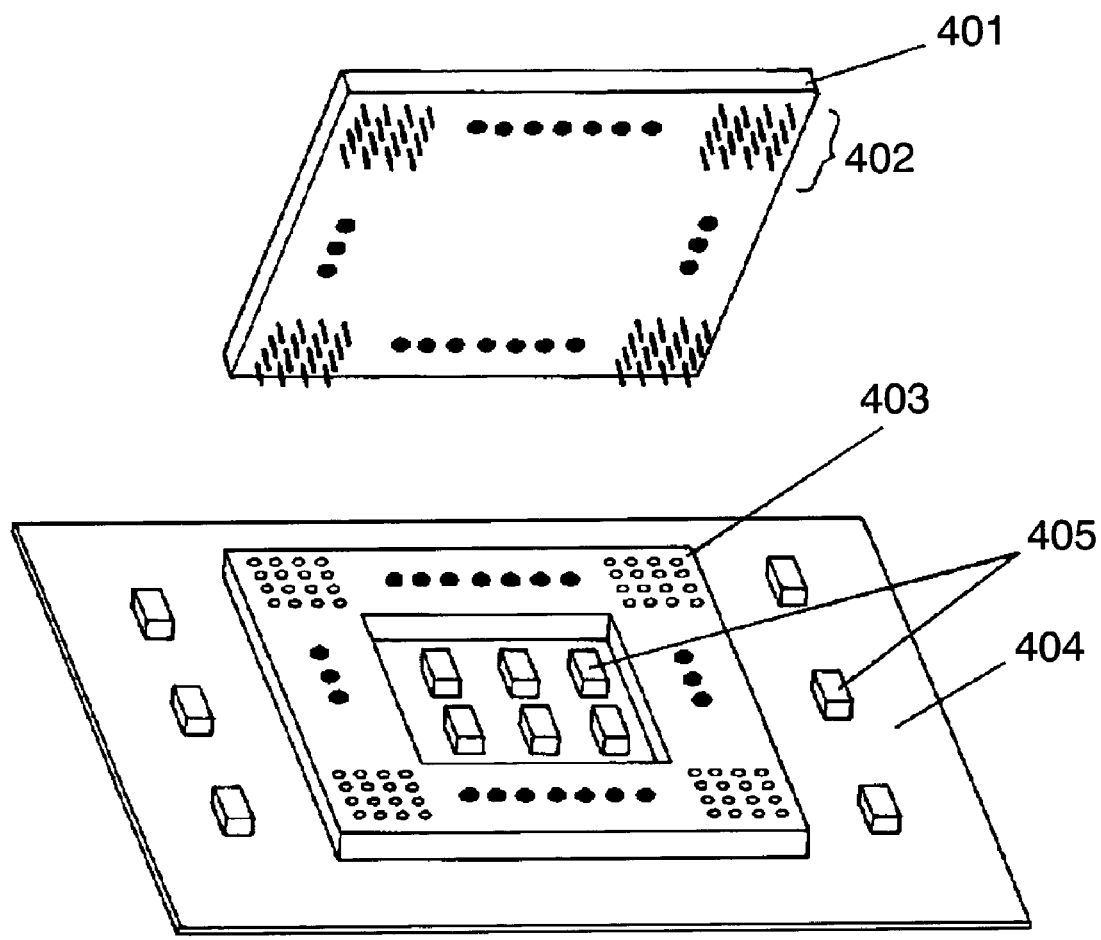

FIG. 53 is a perspective exploded view showing a surrounding status of a CPU in a conventional configuration.

DETAILD DESCRIPTION OF PREFERRED EMBODIMENTS

Referring now to the drawings, preferred embodiments of the invention are specifically described below. In the embodiments, the same parts are identified with the same reference numerals and duplicate explanations is omitted.

EXEMPLARY EMBODIMENT 1

Figure 2:
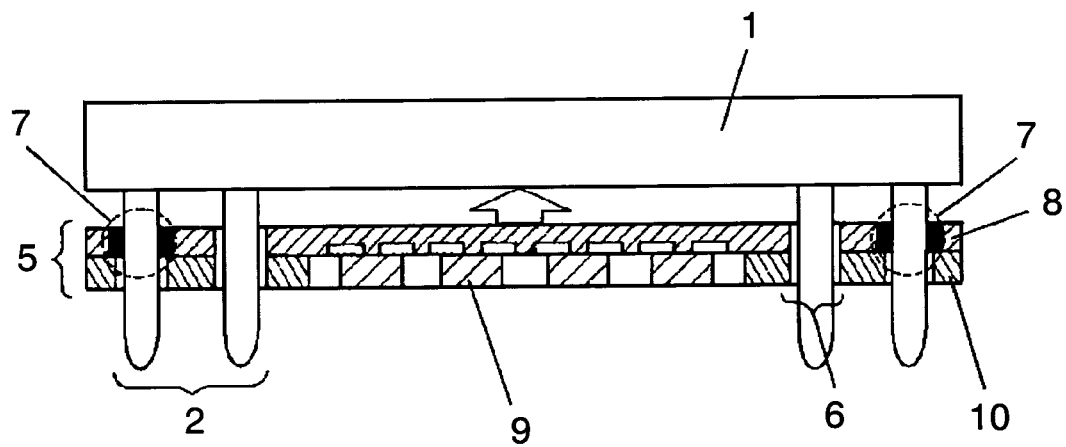
FIG. 2 is a sectional view showing a state of connection of an IC to the sheet capacitor in FIG. 1.

FIG. 1 is a perspective exploded view showing a sheet capacitor in exemplary embodiment 1 of the present invention and a state of its use, and FIG. 2 is a sectional view showing a state of connection of an IC to this sheet capacitor. Connection pins (hereinafter called pins) 2 are provided at the lower side of an IC 1 represented by a CPU. An IC socket (hereinafter called socket) 3 is soldered to a printed wiring board (hereinafter called board) 4. This exemplary embodiment shows an example of using an IC package of 478 pins.

A sheet capacitor (hereinafter called capacitor) 5 has through-holes (hereinafter called holes) 6 for passing the pins 2 of the IC 1. Only in the holes 6 for passing the pins 2 necessary for connection of the IC 1, contact portions 7 (black solid portions in the drawing) conducting with the pins 2 are formed. The capacitor is composed by gluing a flexible printed board (hereinafter called board) 8 mounting capacitor elements 9 to a fixed board (hereinafter called board) 10.

Figure 3A:
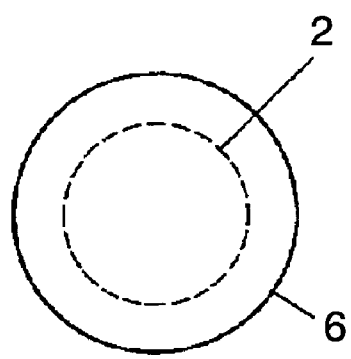

Each of FIG. 3A to FIG. 3D shows a configuration of the contact portion 7. FIG. 3A shows the hole 6 not contacting with the pin 2, in which the size of the hole 6 is preferably more than two times the outer diameter of the pin 2, and the size of the hole 6 is desired to be larger because the contact-free reliability is increased.

Figure 3B:
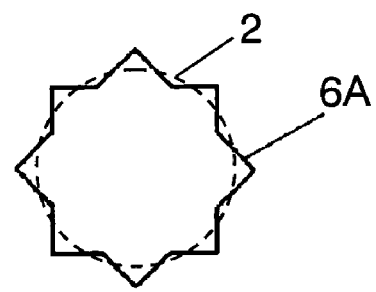

FIG. 3B shows the through-hole 6A which is required to conduct by contacting with the pin 2. The hole 6A is substantially stellate, and the largest diameter is larger than the outer diameter of the pin 2, and the smallest diameter is smaller than the outer diameter of the pin 2. Therefore, the protrusion (the smallest diameter portion) contacting with the pin 2 moves up and down to relax the stress as the pin 2 is inserted and removed, so that the pin 2 can be inserted or removed smoothly.

Figure 3C:
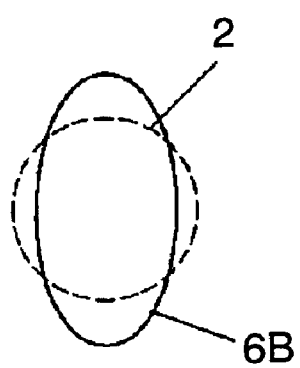

FIG. 3C shows the through-hole 6B which is also required to conduct by contacting with the pin 2. The hole 6B is substantially elliptical, and the major diameter is larger than the outer diameter of the pin 2, and the minor diameter is smaller than the outer diameter of the pin 2. Since there is no edge in this shape, the stress to the contact portion 7 when inserting is small, and cracks are hardly formed, and a secure connection is obtained.

Figure 3D:
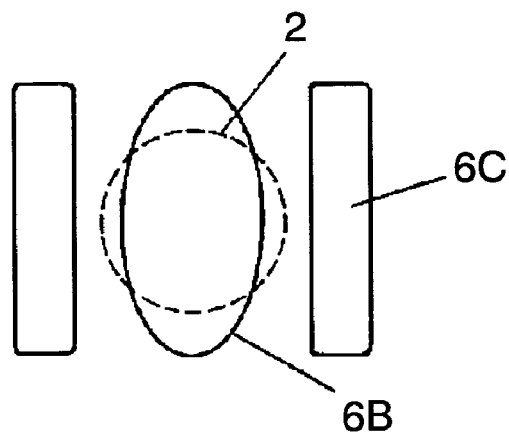

FIG. 3D shows the periphery of the through-hole 6B which is also required to conduct by contacting with the pin 2. In addition to the hole 6B shown in FIG. 3C, slits 6C are disposed adjacently parallel to both sides in the minor diameter direction of the hole 6B so as to absorb the stress when the hole 6B is spread by the pin 2. Since the stress applied to the hole 6B is relaxed by the slits 6C, the pin 2 can be inserted or removed smoothly.

The contact portion of any configuration shown in FIG. 3A to FIG. 3D may be used, or a merely polygonal contact portion may be used.

The capacitor 5 of the present embodiment having such configuration is mounted on the socket 3 by passing the pins 2 of the IC 1 into the holes 6 of the capacitor 5. In this configuration, the IC 1 and the capacitor 5 conduct with each other through the contact portions 7. In such simple structure, the thin sheet capacitor 5 is obtained. The capacitor 5 can be inserted between the IC 1 and the socket 3, so that a sufficient area for mounting capacitor elements at high density can be maintained on the sheet capacitor 5. Besides, since the distance between the capacitor 5 and the IC 1 is short, the ESL is reduced.

EXEMPLARY EMBODIMENT 2

FIG. 4 is a perspective exploded view showing a sheet capacitor in an exemplary embodiment 2 of the present invention, and FIG. 5 is a sectional view showing the configuration of a capacitor element used in the sheet capacitor. FIG. 6 is a perspective exploded view showing a state of use of the sheet capacitor, and FIG. 7 is a sectional view showing a state of connection of an IC to the sheet capacitor.

In FIG. 4, a conductive negative sheet (hereinafter called sheet) 11 has through-holes (hereinafter called holes) 12 for passing connection pins (hereinafter called pins) 2 of an IC 1. Only in the holes 12 for passing the pins 2 necessary for connection of the IC 1, contact portions 13 (black solid portions in the drawing) conducting with the pins 2 are formed. A peripheral portion 14 is reinforced by folding substantially in an L-shape. In this constitution, the bending strength of the sheet capacitor is enhanced without using reinforcing member. An insulating sheet (hereinafter called sheet) 15 is disposed outside of the sheet 11 (the lower side in the drawing). An insulating sheet (hereinafter called sheet) 16 made of polymer material is disposed inside of the sheet 11 (the upper side in the drawing), and an opening 20A is formed in the center of the sheet 16.

A conductive positive sheet (hereinafter called sheet) 17 has through-holes (hereinafter called holes) 18 for passing the pins 2 of the IC 1. Only in the holes 18 for passing the pins 2 necessary for connection of the IC 1, contact portions 19 (black solid portions in the drawing) conducting with the pins 2 are formed. An opening 20B is formed in the center. A sheet capacitor element 21 has a positive end 22 and a negative end 23. The sheet 16 forms an insulating layer for insulating the sheet 11 from sheet 17. An insulating sheet (hereinafter called sheet) 24 is disposed on the top of the sheet 17, and the sheet 24 has through-holes (hereinafter called holes) 25 for passing the pins 2 of the IC 1. Like the sheet 11, the sheet 17 may be folded in an L-shape in the periphery, and reinforced.

In the sheet capacitor of the exemplary embodiment having such configuration, the sheet 16 and the conductive sheet 17 are laminated and joined at the inside of the conductive sheet 11 having the sheet 15 joined to the outside. The capacitor element 21 is disposed in the overlaid openings 20A, 20B disposed in the center of the sheets 16 and 17. Thus, since the capacitor element 21 is disposed in the openings 20A, 20B, the thin sheet capacitor is obtained. The positive end 22 of the capacitor element 21 is electrically connected to the sheet 17, and the negative end 23 to the sheet 11. The sheet 24 serves as a sealing member so as to cover the sheet 17. In this explanation, the opening 20B is provided in the sheet 17, but it may be provided in the sheet 11.

Openings 26 and 27 are provided in the sheets 15 and 24, respectively, so that test pins may directly contact with the conductive sheets 11 and 17. In this constitution, therefore, circuit checking of mounted parts or electric power supply in an aging process of the capacitor element 21 can be done without passing through the contact portions 19. At the same time, the contact portions 19 connected to the pins 2 can be protected in the production process. By forming the openings 26, 27 widely, the electric power can be supplied smoothly and securely in the aging process necessary for production of the capacitor element 21.

The sheets 15, 16, 24 may be formed of insulating paint such as epoxy or melamine, insulating sheet material such as polyethylene terephthalate (PET), polypropylene (PP) or polycarbonate (PC), or heat resistant insulating sheet material such as polyimide (PI) or polyamide imide (PAI). Or sheets may be adhered by using adhesive (or tacky agent). Further, a package may be formed by coating with resin, the surface may be covered with an insulating sheet, or coated with coating material or printed with insulating paint.

The conductive sheets 11, 17 having contact portions 13, 19 are preferred to be composed of an elastic material such as gold-plated phosphor bronze for spring, or stainless steel (SUS), from the viewpoint of stability of connection. However, the sheets 11, 17 may also be composed of a copper, iron or aluminum sheet, or a laminated sheet of elastic film and metal foil.

FIG. 5 is a sectional view showing a detailed configuration of the sheet capacitor element 21. A dielectric oxide film 28 is formed on the surface of the electrode body having the positive end 22. On its surface, a solid electrolyte layer 29 of functional polymer is further formed by polymerization, and a negative layer of carbon and silver paint is further formed on the surface as the negative end 23. The thickness of the negative layer is formed within at least 0.1 mm and at most 0.2 mm, and the upper surface and lower surface of the negative end 23 conduct with each other via notches 30 provided at the sides.

As shown in FIG. 6, a sheet capacitor (hereinafter called capacitor) 31 having such configuration is mounted on the IC socket 3 by penetrating the pins 2 at the lower side of the IC 1 in through-holes 32 formed in the capacitor 31. The through-holes 32 are integrally formed of the through-holes 12, 18, 25. The IC 1 and the capacitor 31 conduct with each other via contact portions 33 (black solid portions in the drawing). The contact portions 33 are integrally formed of the contact portions 13, 19. In such simple configuration, the thin sheet capacitor 31 is obtained. In this constitution, since the capacitor element 21 is connected from the roots of the pins 2, the ESL due to wiring between the capacitor element 21 and the IC 1 is considerably decreased.

Meanwhile, as shown in FIG. 7, in the state of the IC 1 mounted on the capacitor 31, since the holes 12, 18 formed in the conductive sheets 11, 17 are larger than the pins 2, the holes 12, 18 do not connect electrically with the pins 2. On the other hand, the contact portion 13 formed in the sheet 11 contacts with a connection pin 2A, and is connected electrically. By contrast, the holes 18 of the upper sheet 17 are formed larger. Therefore, the hole 18 does not contact with the pin 2A, and only the sheet 11 electrically contacts with the pin 2A. Similarly, the contact portion 19 formed in the sheet 17 contacts with a pin 2B and is connected electrically. On the other hand, through-holes 11A of the lower sheet 11 are formed larger. Therefore, the through-hole 11A does not connect with the pin 2B, but only the sheet 17 electrically connects with the pin 2B.

The negative pin 2A for connection of the IC 1 is connected to the negative end 23 of the capacitor element 21 via the contact portion 13 and sheet 11. On the other hand, the positive pin 2B for connection of the IC 1 is connected to the positive end 22 of the capacitor element 21 via the contact portion 19 and sheet 17. Generally, both the sheet 17 and the positive end 22 are made of metal, and they are connected by electric or laser welding, or crimping or ultrasonic fusion. The sheet 11 and negative end 23 are made of metal and conductive material respectively, and they are connected by conductive ink, adhesive, or pressing.

EXEMPLARY EMBODIMENT 3

FIG. 8 is a perspective exploded view showing a configuration of a sheet capacitor in an exemplary embodiment 3 of the present invention, and FIG. 9 is its sectional view. This embodiment is similar to the embodiment 2 except that two capacitor elements are laminated and mounted, and that each capacitor element differs in characteristics. Other aspects of the configuration are the same as in the embodiment 2.

As in the embodiment 2, an insulating sheet (hereinafter called sheet) 16 and a conductive positive sheet (hereinafter called sheet) 17 are laminated and joined at the inside of a conductive negative sheet (hereinafter called sheet) 11. A capacitor element 21 is disposed in an opening 20 disposed and overlaid in the center of the sheets 16, 17. A positive end 22 of the capacitor element 21 is electrically connected to the sheet 17, and a negative end 23 to the sheet 11. Thus, a laminated body is formed. An insulating sheet (hereinafter called sheet) 24 seals the sheet 17 so as to cover the sheet 17. Thus, a first sheet capacitor is composed.

Beneath the sheet 11, an insulating sheet (hereinafter called sheet) 34 and a second conductive positive sheet (hereinafter called sheet) 35 are laminated and joined. A capacitor element 37 is disposed in an opening 36 disposed and overlaid in the center of the sheets 34, 35. A positive end 38 of the capacitor element 37 is electrically connected to the sheet 35, and a negative end 39 to the sheet 11. Thus, a laminated body is formed. An insulating sheet 40 seals the sheet 17 so as to cover the sheet 17. Thus, a second sheet capacitor is composed.

In FIG. 9, a contact portion 13 of the sheet 11, a contact portion 19 of the sheet 17, and a contact portion 41 of the sheet 35 are configured to contact with the pins 2.

Thus, in the sheet capacitor of the present embodiment, a plurality of capacitor elements different in type or characteristic are formed integrally in one sheet capacitor. In an IC, generally, about ¼ to ⅓ of the components are composed of a power supply line of the same system. Therefore, in this constitution, the plurality of capacitor elements 21, 37 can be connected in batch. Moreover, capacitor elements 21, 37 of individual withstand voltages can be connected to pins 2 of different voltages of the IC 1. As a result, the entire structure is greatly reduced in size and thickness.

EXEMPLARY EMBODIMENT 4

FIG. 10 is a perspective exploded view showing a configuration of a sheet capacitor in an exemplary embodiment 4 of the present invention, and FIG. 11 is its sectional view. This embodiment is similar to the embodiment 2 except that two capacitor elements are laminated and mounted, and that each capacitor element differs in characteristics. Other aspects of the configuration are the same as in the embodiment 2.

On a conductive negative sheet (hereinafter called sheet) 11, conductive positive sheets (hereinafter called sheets) 42, 43 are laminated respectively via insulating sheets (hereinafter called sheets) 44, 45 alternately. A positive end 38 of the capacitor element 37 is electrically connected to the sheet 42, and a negative end 39 to the sheet 11. Further, the positive end 22 of the capacitor element 21 different in withstand voltage or characteristic from the capacitor element 37 is connected to the sheet 43, and the negative end 23 to the sheet 11. An insulating sheet 46 seals the sheet 43 so as to cover the sheet 43. Thus, a sheet capacitor is composed.

In FIG. 11, a contact portion 47 of the sheet 11, a contact portion 48 of the sheet 42 as the positive electrode of the capacitor element 37, and a contact portion 49 of the sheet 43 as the positive electrode of the capacitor 21 contact with the pins 2 of the IC 1.

Thus, in the sheet capacitor of the present embodiment, as in the embodiment 3, a plurality of capacitor elements different in type or characteristic are formed integrally in one sheet capacitor. Therefore, in this constitution, as in the embodiment 3, capacitor elements 21, 37 of individual withstand voltages can be connected to the pins 2 of different voltages of the IC 1. As a result, the entire structure is greatly reduced in size and thickness.

EXEMPLARY EMBODIMENT 5

FIG. 12 is a perspective exploded view showing a configuration of a sheet capacitor in an exemplary embodiment 5 of the present invention, and FIG. 13 is its sectional view. This embodiment is similar to the embodiment 2 except that a plurality of capacitor elements of the sheet capacitor are mounted. Other aspects of the configuration are the same as in the embodiment 2.

On a conductive negative sheet (hereinafter called sheet) 11, a conductive positive sheet (hereinafter called sheet) 17 is laminated via an insulating sheet (hereinafter called sheet) 16. A positive end 51 of each of a plurality of capacitor elements 50 is electrically connected to the sheet 17, and a negative end 52 to the sheet 11. Insulating sheets 24, 15 seal them. Thus, a sheet capacitor is composed.

In FIG. 13, a contact portion 53 of the sheet 11 as a negative electrode of the capacitor elements 50, and a contact portion 54 of the sheet 17 as a positive electrode of the capacitor elements 50 contact with the connection pins 2 of the IC 1.

Thus, in the sheet capacitor of the present embodiment, the capacitor element is divided into a plurality. As a result, the stress applied to the capacitor elements 50 caused by warping of the sheet capacitor can be relaxed. That is, it is effective to suppress fluctuations of the LC due to stress or thermal expansion applied when inserting the sheet capacitor into the IC 1.

EXEMPLARY EMBODIMENT 6

FIG. 14 is a sectional view showing a sheet capacitor in an exemplary embodiment 6 of the present invention and a state of its use. Connection pins 2 of an IC 1 are inserted into an IC socket 3 provided in a printed wiring board 4. In the center of a sheet capacitor 55, a recess 56 is formed in a size for fitting into a cavity of the IC socket 3, and a capacitor element 57 is installed in the recess 56.

Thus, in the sheet capacitor of the present embodiment, the tall capacitor element 57 can be installed in the capacitor element 55. Or, if attempted to assemble the sheet capacitor 55 upside down, the connection pins 2 cannot be inserted into the IC socket 3, or contact with other electronic components 58. Therefore, insertion of sheet capacitor 55 in the wrong direction can be prevented.

EXEMPLARY EMBODIMENT 7

FIG. 15 is a perspective exploded view showing a sheet capacitor in an exemplary embodiment 7 of the present invention and a state of its use, FIG. 16 is its sectional view, and FIG. 17 is a perspective exploded view showing a configuration of the sheet capacitor.

Connection lands (hereafter called lands) 59 are provided at the lower side of an IC 1. A printed wiring board (hereinafter called board) 4 has connection lands (hereinafter called lands) 60. Connection lands (hereinafter called lands) 62 are provided at the upper side of a sheet capacitor (hereinafter called capacitor) 61, and are connected to the lands 59. Similarly, at the lower side, there are connection lands 72 for connection with the lands 60. The lands 62,72 are connected integrally via a through-hole 71. The black solid portions in FIG. 15 are power supply lands 63 (hereinafter called lands) provided at the upper side of the sheet capacitor 61. The lands 63 are connected integrally in the vertical direction via a through-hole same as the lands 62, and are also connected electrically to incorporated capacitor elements 67, 68.

The sheet capacitor 61 thus composed is placed between the IC 1 and the board 4. In this configuration, the surface area for mounting the capacitor elements on the sheet capacitor 61 is maintained. The sheet capacitor 61 is fixed mechanically and connected electrically at the same time by a solder ball connection method or the like by the lands 62 provided corresponding to the lands 59, 60 respectively. In this constitution, the IC 1, the board 4 and the sheet capacitor 61 can be connected in the same manner as in the conventional process.

In FIG. 17, a first insulating board (hereinafter called board) 64 is formed substantially in a same shape as the IC 1. A positive junction 65 and a negative junction 66 are connected respectively to a positive end and a negative end provided in the capacitor elements described below. The capacitor elements 67, 68 are different in type and characteristic. A second insulating board (hereinafter called board) 69 is formed substantially in the same shape as the IC 1, and thicker than the height of the capacitor elements 67, 68. A square notch 70 is provided in the center of the board 69. Lands 62 and lands 63 are provided in the boards 64, 69, respectively.

In this way, the insulating substrate is divided, and the capacitor elements 67, 68 are disposed in one notch. Therefore, the sheet capacitor 61 is further reduced in thickness. At the same time, the capacitor elements 67, 68 can be connected via the lands 59 of the IC 1. Therefore, the value of the ESL due to wiring between the capacitor elements 67, 68 and the IC 1 is considerably decreased. Moreover, the insulating boards 64, 69 are formed substantially in the same shape as the IC 1, and the pitch of connection lands provided in the insulating boards 64, 69 corresponds to the pitch of the connection lands 59 provided in the IC 1. Accordingly, in the same shape as the IC 1, one common electronic component element (large capacity capacitor or power source module) can be connected in batch in the connection lands 59 of the IC 1. Hence, the entire circuit including the IC 1 can be reduced in size and thickness.

Also as shown in FIG. 16, the capacitor 61 has the through-holes 71 conducting in the vertical direction in a state integrally joining the board 64 and the board 69, formed corresponding to the pitch of the lands 59. Via the through-holes 71, lands 62 connecting with the IC 1 are disposed at the upper side, and lands 72 connecting to the board 4 at the lower side.

Further, on the board 64, the capacitor elements 67, 68 are installed inside of the notch 70 in the board 69. The capacitor elements 67, 68 are coated with an insulating portion 73 made of heat resistant resin such as rubber resin, polyimide, polyamide, phenol or the like. Thus, the sheet capacitor 61 is composed.

The capacitor element 67 is composed by forming a functional polymer layer on the outer surface of a positive foil 74 forming a dielectric oxide film layer, and further forming a negative end 75 on its outer surface. The positive foil 74 is joined to the positive junction 65, and the negative end 75 to a negative junction 66 by welding or other connecting method using conductive paste made of silver or carbon, and they conduct with each other electrically. Similarly, the capacitor element 68 is composed by forming a functional polymer layer on the outer surface of a positive foil 76 forming a dielectric oxide film layer, and further forming a negative end 77 on its outer surface. The positive foil 76 is joined to the positive junction 65, and the negative end 77 to the negative junction 66 by welding or other connecting method using conductive paste made of silver or carbon, and they conduct with each other electrically. The negative ends 75, 77 are made of silver paste and carbon.

In FIG. 16, an insulating layer 78 insulates the wiring portion formed in the capacitor 61. Solder balls 79 are connected to the lands 59 of the IC 1, and solder balls 80 are connected to the lands 60 of the board 4. Thus, disposing the solder balls 79, 80, by reflowing by placing the capacitor 61 between the IC 1 and board 4, the board 4, the capacitor 61, and the IC 1 are laminated and formed integrally.

In such constitution, a plurality of the capacitor elements 67, 68 different in type or characteristic can be connected by adjusting to the operating voltage and capacity of the IC 1. Still further, a capacitor can be added without changing the shape of the lands 60 formed in the board 4. Accordingly, the circuits can be added or a noise countermeasure can be reinforced without modifying the pattern on the board 4. As a result, the product development period can be shortened considerably.

In this embodiment, the IC 1 is explained as a leadless type, but it is not limited to this example alone. For example, by using a flat package type, by forming connection lands with the IC by matching with the lead pitch, an IC of a flat package type and the sheet capacitor of the present embodiment can be connected.

Further, as the board 64 and board 69, printed wiring boards of a multilayer structure may be also used.

EXEMPLARY EMBODIMENT 8

FIG. 18 is a sectional view of a sheet capacitor in an exemplary embodiment 8 of the present invention. An IC 81 has connection leads 82. Through-holes 84 are formed to conduct vertically with an insulating board (hereinafter called board) 83. Connection lands (hereinafter called lands) 85 with the leads 82 of the IC 81 are disposed on the upper side of the board 83. Lands 86 connect with connection lands 60 of a printed wiring board (hereinafter called board) 4 disposed at the lower side of the board 83. A wiring portion 88 connects the lands 85, 60 and a chip capacitor 87. Solder balls 89 are for connection between the lands 86 and the lands 60. The chip capacitor 87 is disposed on the outer periphery of the IC 81. Thus, a sheet capacitor (hereinafter called capacitor) 90 is composed.

In such configuration, the lands 85 disposed at the upper side of the capacitor 90 are connected to the lands 82 of the IC 81, and the lands 86 disposed at the lower side of the capacitor 90 are connected to the lands 60 of the board 4, thereby conducting with each other. As a result, the sheet capacitor 90 can be inserted between the IC 81 and the board 4. Therefore, the surface area for mounting the capacitor elements can be maintained in the sheet capacitor 90. Further, the insulating board can be composed of one piece only, and the cost is lowered.

EXEMPLARY EMBODIMENT 9

FIG. 19 is a sectional view showing a configuration of a sheet capacitor in an exemplary embodiment 9 of the present invention, and FIG. 20 is its perspective exploded view. A capacitor element 92 is installed in a main body 91 of a sheet capacitor. The capacitor element 92 is composed by laminating and forming a conductive polymer layer 94 and a negative layer 95 of carbon and silver paste on a positive foil 93 forming a dielectric oxide film on the surface.

The positive foil 93 is connected to a conductive positive sheet (hereinafter called sheet) 96 and is hence connected to a connection pin 2 of an IC 1 via a contact portion 97. Further, the negative layer 95 is connected to a negative sheet (hereinafter called sheet) 98 and is hence connected to another connection pin (hereinafter called pin) 2 of the IC via a contact portion 99. The sheets 96, 98 respectively serve also as positive end wiring and negative end wiring, and are made of SUS, phosphor bronze for spring, or the like. The capacitor element 92 thus composed is closed by a cover sheet 100 of an insulating material, so that the main body 91 of the sheet capacitor of the present embodiment is composed.

A slide plate 101 is formed in a box shape with an open top. A guide 102 is disposed oppositely to the upper end of the slide plate 101. The guide 102 is mounted on the top end of the main body 91, and the slide plate 101 is mounted on the main body 91. As a result, the slide plate 101 is slidably held in the lateral direction in FIG. 19 on the main body 91.

In this state, a spring 104 is compressed and inserted into a spring compartment 103 formed between the slide plate 101 and the main body 91. As a result, a force is generated to move the slide plate 101 in the right side direction in the drawing and the main body 91 in the left side direction. By this force, the pins 2 are enclosed by through-holes 105 provided in the slide plate 101 and the contact portions 97, 99. In this configuration, in the compressed state of the spring 104, the through-holes 105 formed larger than the pins 2 move in the left side direction. Therefore, the main body 91 can be inserted and removed and replaced very easily.

A reinforcement 106 supports the spring 104. A through-hole 107 is provided to penetrate through the top and bottom of the negative layer 95 of the capacitor element 92. The spring 104 is a forming member for thrusting the main body 91 and/or slide plate 101, and may be made of rubber or other elastic element aside from a spring.

The main body 91 having such configuration is disposed between the IC 1 and the board 4. The pins 2 of the IC 1 pass through-holes 108 of the main body 91, and fitted to the IC socket 3, so that the IC 1 and the main body 91 conduct with each other via the contact portions 109. In such simple configuration, the thin sheet capacitor is obtained. In this configuration, in the matched state of the through-holes 105 of the slide plate 101 and the through-holes 108 of the main body 91, the pins 2 can be easily inserted in and removed from the through-holes. In the state of use, since an elastic force acts in the pinching direction of the pins 2 on the holes 105 of the slide plate 101 and the contact portions 109, the pins 2 are locked, and the contact portions 109 and the pins 2 are securely connected electrically. Moreover, since the contact portions 109 are elastic, if the pitch of the pins 2 is deviated, such pitch deviation can be absorbed by the elasticity of the contact portions 109.

EXEMPLARY EMBODIMENT 10

FIG. 21A and FIG. 21B show a configuration of a contact portion of a sheet capacitor in an exemplary embodiment 10 of the present invention. The other configuration is the same as in the embodiment 9.

A through-hole 108 for inserting a connection pin (hereinafter called pin) 2 of an IC 1 is formed larger than the pin 2. A through-hole (hereinafter called hole) 105 is provided in a slide plate 101. A semicircular through-hole 110 having a straight portion is formed in elastic conductive sheets 96, 98. A slit 111 is formed closely to a through-hole 110. An elastic contact portion 112 is formed between the through-hole 110 and the slit 111.

In the contact portion 112, as shown in FIG. 21B, when the pin 2 of the IC 1 is inserted and the slide plate 101 moves in the arrow direction in the drawing, the hole 105 also moves in the same direction. Accordingly, pinching the pin 2, the elastic contact portion 112 deforms so as to be deflected to the side of slit 111. By this deformation, if the pitch of the pins 2 is deviated, the elastic contact portion 112 causes the pin 2 to contact securely with the contact portion 112. In the state in FIG. 21A, the hole 105 of the slide plate 101 does not contact with the pin 2, and therefore the pin 2 can be inserted or removed easily.

FIGS. 22A and 22B are plan views showing another example of the contact portion, and FIGS. 22C and 22D are their sectional views, respectively. A through-hole (hereinafter called hole) 113 is formed in an elastic conductive sheet (hereafter called sheet) 114, and has a protrusion in the inside. By inserting the pin 2 into the hole 113 and folding the protrusion, an elastic contact portion 115 is formed. In a conductive sheet 116 of opposite electrode side, a large opening 117 is formed so as not to conduct with the pin 2. An insulating sheet 118 keeps insulation between the conductive sheets 114 and 116. A cover sheet 119 covers the sheet 114.

In the contact portion 115 having such configuration, as shown in FIGS. 22B and 22D, when the pin 2 is inserted and the slide plate 101 moves in the arrow direction in the drawing, the hole 105 also moves in the same direction. Accordingly, pinching the pin 2, the elastic contact portion 115 deforms so as to be deflected to the outside. By this deformation, if the pitch of the pin 2 is deviated, the contact portion 115 is elastic, and hence causes the pin 2 to contact securely with the contact portion 115. In the state in FIGS. 22A and 22C, the hole 105 of the slide plate 101 does not contact with the pin 2, and therefore the pin 2 can be inserted or removed easily.

EXEMPLARY EMBODIMENT 11

FIG. 23 is a perspective exploded view showing a configuration of a sheet capacitor in an exemplary embodiment 11 of the present invention, and FIG. 24 is a sectional view showing a state of connection of an IC to the sheet capacitor. Each of FIGS. 25A and 25B is a plan view showing the contact portion of the exemplary embodiment 11.

A conductive positive sheet (hereinafter called sheet) 120 has through-holes (hereinafter called holes) 121 for passing connection pins (hereinafter called pins) 2 of an IC 1. Only in the holes 121 for passing the pins 2 necessary for connection with the IC 1, among the holes 121, contact portions 122 (black solid portions in the drawing) conducting with the pins 2 are formed. An opening 123 is formed in the center.

A first negative sheet (hereinafter called sheet) 124 has through-holes (hereinafter called holes) 125 for passing the pins 2. Only in the holes 125 for passing the pins 2 necessary for connection with the IC 1, among the holes 125, contact portions 126 (black solid portions in the drawing) conducting with the pins 2 are formed. A peripheral edge (end face) is reinforced by a folded portion 127 folded substantially in an L-shape.

A second negative sheet (hereinafter called sheet) 128 has through-holes (hereinafter called holes) 129 for passing the pins 2. Only in the holes 129 for passing the pins 2 necessary for connection with the IC 1, among the holes 129, contact portions 130 (black solid portions in the drawing) conducting with the pins 2 are formed. A peripheral edge (end face) is reinforced by a folded portion 131 folded substantially in an L-shape.

Insulating sheets (hereinafter called sheets) 132, 133 have through-holes 134 for passing the pins 2. There are openings 135A, 135B in the center. Insulating sheets (hereinafter called sheets) 136, 137 have through-holes 138 for passing the pins 2. A sheet capacitor element 139 has an positive end 140 and a negative end 141.

In the sheet capacitor of the present embodiment having such configuration, the sheets 132, 133 are disposed on the face and back surfaces of the sheet 120, and they are enclosed by the sheet 124 and sheet 128. The capacitor elements 139 are disposed in the overlaid openings 123, 135A, 135B disposed in the center of the sheet 120 and the sheets 132, 133. The positive end 140 of the capacitor element 139 is electrically connected to the sheet 120, and the negative end 141 to the sheets 124, 128, respectively through a conductor 142. The sheet 136 covers the sheet 124, and the sheet 137 covers the sheet 128.

In FIG. 24, a contact portion 143 connects the pin 2 and sheet 120. A contact portion 144 connects the pin 2 and sheets 124, 128. A through-hole 145 does not conduct with the pin 2. A weld zone 146 electrically conducts the folded portion 127 of the sheet 124 and the folded portion 131 of the sheet 128, and the sheet 120 is shielded in this structure. Thus, the sheet capacitor of the present embodiment is composed.

The sheets 120, 124, 128 are preferably made of material having a conductive spring property such as phosphor bronze for spring, SUS, nickel silver, or beryllium copper, and the thickness is preferably 0.05 to 0.25 mm, so that it is smooth to insert or remove. The sheets 132, 133, 136, 137 may be made of inexpensive general resins such as PET, polyamide (PA), PC, or heat resistant polyphenylene sulfide (PPS), PI, polyether ether ketone (PEEK) or the like. Other materials include hard board of ceramic or glass having a sheet shape, and acrylic, silicone or melamine insulating paint. For the ease of handling, the sheet thickness may be 0.03 to 0.2 mm, and the ESL is lower as the thickness is smaller in the insulating sheet between electrodes. When using an insulating paint, the thickness is preferred to be 5 to 20 μm, and selection of sheet or insulating paint may be determined freely depending on the manufacturing method, cost, or the like.

In the sheet capacitor of the present embodiment having such configuration, the current flowing in the capacitor element 139 is branched into two flows, that is, a first current loop 147 and a second current loop 148 as indicated by solid lines in FIG. 24. In the current loop 147 at the lower side in the drawing, the current flows in the sequence of the positive end 140, the contact portion 122 of the sheet 120, the pin 2, the IC 1, the pin 2, the contact portion 126 of the sheet 124, and the negative end 141. In the second current loop 148 at the upper side in the drawing, the current flows in the sequence of the positive end 140, the contact portion 122 of the sheet 120, the pin 2, the IC 1, the pin 2, the contact portion 130 of the sheet 128, and the negative end 141.

Therefore, by the two current loops 147, 148 flowing at the upper side and lower side, the current is divided into the upper side and lower side, and returns to the capacitor element 139. Moreover, at the upper side and lower side, the current loops are in reverse directions, and the generated magnetism cancels each other. As a result, the ESL is decreased, and the ESL up to the pins 2 is extremely small.

In this configuration, the smaller the difference in the flowing area of the upper side current loop 147 and lower side current loop 148, the more is suppressed the generation of magnetism, and the ESL becomes smaller. By the weld zone 146, the sheet 124 and the sheet 128 conduct with each other at their ends, thereby covering the sheet 120. Accordingly, the ESR and ESL become extremely small.

Meanwhile, of the sheet 124 and the sheet 128, the contact portion may be provided in only one, and the sheet 124 and sheet 128 may be composed to connect with each other electrically at the ends by way of the weld zone 146. In this configuration, since the contact portion is formed only at one of the negative sheets, it is easier to insert and remove the pins 2.

In this embodiment, the area excluding the holes 125, 129 and the contact portions 126, 130 of the sheets 124, 128 is covered with the sheets 132, 133 or an insulating layer composed of insulating paint. In this configuration, the negative lines are not touched directly by hand, and breakdown of the IC 1 or the like due to static electricity at the time of mounting can be prevented.

FIGS. 25A, 25B show a through-hole not contacting with the pin 2, and a contact portion contacting with the pin 2, respectively. In FIG. 25A, as compared with the outer diameter of the pin 2, a through-hole 149 not contacting with the sheets 120, 124, 128 is formed larger. A through-hole 150 of the insulating sheet is formed smaller than the through-hole 149 in order to keep insulation between the pin 2 and the sheets 120, 124, 128.

In FIG. 25B, a contact portion 151 provided in the sheets 120, 124, 128 and contacting with the pin 2 is formed in an elliptical shape of which the minor diameter is smaller and the major diameter is larger than the outer diameter of the pin 2. Thus, by combination of FIG. 25A and FIG. 25B, the pin 2 and the sheets 120, 124, 128 can be brought into contact arbitrarily.

EXEMPLARY EMBODIMENT 12

FIG. 26 is a perspective exploded view showing a configuration of a sheet capacitor in an exemplary embodiment 12 of the invention, FIG. 27 is its sectional view, and FIG. 28 is a sectional view showing a state of connection of an IC to the sheet capacitor.

A negative sheet (hereinafter called sheet) 152 is a gold-plated conductor made of phosphor bronze for spring. The sheet 152 has through-holes 153 matched with the pitch of connection pins (hereinafter called pins) 2 of an IC 1, and contact portions 154B to which connection negative pins (hereinafter called pins) 2B of the IC 1 are connected. A negative foil (hereinafter called foil) 155 is electrically connected and mechanically bonded to substantially the center of the sheet 152 via a junction 156A formed by ultrasonic fusion, cold pressing or other method.

A positive sheet (hereinafter called sheet) 157 is a gold-plated conductor made of phosphor bronze for spring. The sheet 157 has the through-holes 153 matched with the pitch of the pins 2 of the IC 1, and contact portions 154A to which connection positive pins (hereinafter called pins) 2A of the IC 1 are connected. A positive foil (hereinafter called foil) 158 is electrically connected and mechanically bonded to substantially the center of the sheet 157 via a junction 156B formed by ultrasonic fusion, cold pressing or other method. The foils 115, 158 respectively function as the negative electrode and positive electrode.

A separator 159 is disposed between the sheet 152 and the sheet 157 impregnated in gel electrolyte (not shown). That is, the foil 155 and foil 158 are opposite to each other across the separator 159. By using the gel electrolyte, the electrolyte does not flow out when sealing the electrode component portion, so that defective sealing is prevented.

A sealing sheet 160 having an opening in the center is made of an insulating material such as polyethylene, PET, epoxy, melamine, or silicone resin. The sealing sheet 160 is disposed between the sheet 152 and the sheet 157, and bonds them integrally by adhesion or thermal fusion, and also seals the foils 155 and 158 together with the interposing separator 159. Insulating sheets 161, 162 have through-holes 153 provided at the pitch of the pins 2, and are adhered to the outer surface side of the sheet 152 and the sheet 157. Instead of the sheets 161, 162, insulating coating may be applied on the outer surface of the sheets 152, 157.

In this manner, a sheet capacitor (hereinafter called capacitor) 163 of the present embodiment is composed. In this configuration, electricity is directly supplied from the sheets 152, 157 to the foils 155, 158, respectively. Therefore, the ESR is reduced. Besides, since the electric conductive paths composed of the sheet 157 and the sheet 152 are tightly adjacent, the ESL is also reduced. Structurally, further, the overall thickness of the capacitor 163 is reduced.

Preferably, the electrode composing parts composed of the foil 158, separator 159, and foil 155 should be sealed by evacuating to less than the atmospheric pressure. In this configuration, since the electrodes contact tightly with each other via the separator 159, and the distance of electrodes is stable, and changes of the characteristics are smaller.

The capacitor 163 of the present embodiment having such configuration has the through-holes 153 for passing the pins 2 of the IC 1. Only in the through-holes 153 for passing the pins 2 necessary for connection with the IC 1, contact portions 154A, 154B (black solid portions in the drawing) conducting with the pins 2 are formed. By passing the pins 2 of the IC 1 through the through-holes 153 of the capacitor 163 and fitting to the IC socket 3, the IC 1 and capacitor 163 conduct with each other via the contact portions 154A, 154B. In this configuration, the capacitor 163 can be inserted between the IC 1 and the IC socket 3. Therefore, the space for mounting the capacitor 163 on the printed board is not needed. Generally, about ¼ to ⅓ of components are composed of a power supply line of the same system. According to this configuration, plural power source pins can be connected in batch.

In FIG. 28, pins 2 are not connected to the through-holes 153A. In the through-hole 153B, pin 2A is connected through contact portion 154A. In the through-hole 153C, pin 2B is connected through contact portion 154B.

The sheets 152, 157 are made of gold-plated elastic conductive metal. Thus, corrosion of the sheets 152, 157 by the electrolyte can be prevented. Moreover, elastic spring materials can be used in the contact portions 154A, 154B, and the reliability is notably enhanced when inserting in and removing from the IC. Instead of gold-plating, the portions contacting with the electrolyte except for the foils 155, 158 of the sheets 152, 157 may be coated with insulating paint. Also by coating the outer surface of the sheets 152, 157 with insulating coating or insulating sheet, current leakage due to contact with other electronic components mounted on the same printed wiring board can be prevented.

FIG. 29 shows a structure of the contact portion 154A, in which the left side shows the state before insertion of the pin 2A, and the right side shows the state after insertion. An elliptical through-hole 164 is provided in the contact portion 154A to which the pin 2A of the IC 1 is connected, and the through-hole 164 is formed in a dimension having the major diameter longer than the diameter of the pin 2A and the minor diameter shorter than its diameter. This shape is free from corners, and the stress to the contact portion 154A is relaxed, and the contact portion 154A is hardly cracked. A through-hole 165 is formed in the sealing sheet 160, and is formed in a smaller diameter than the diameter of a through-hole 166 of the sheet 152. Thus, the insulation is assured. A through-hole 167 is provided in an insulating sheet 162, and is formed somewhat larger so that the effect may be slight if adhesion is deviated.

FIG. 30 shows a case of laminating a plurality of electrode foils of the sheet capacitor of the present embodiment. In this configuration, negative foils (hereinafter called foils) 168, separators 169, and positive foils (hereafter called foils) 170 are laminated alternately, and the foils 168 and foils 170 are respectively connected electrically with each other. The foils 168 are connected to the sheet 152 by ultrasonic fusion or other method. A junction 171 formed by extending part of the electrode positioned at the outermost end of the foil 170 is connected to the sheet 157. The junction 171 may be also formed at the outermost end of the foil 168, and connected to the sheet 152. In such configuration, the capacitor capacity can be easily increased.

In this configuration, the junction 171 provided in the foil 170 electrically connects the sheet 157 and the foil 170 in an open state of the sheet 157 by ultrasonic fusion or other method. Or, by folding the junction 171, the sheet 157 and the sheet 152 can be closed.

EXEMPLARY EMBODIMENT 13

FIG. 31 is a sectional view showing a configuration of a sheet capacitor in an exemplary embodiment 13 of the present invention. In this embodiment, a positive electrode and a negative electrode are formed in part of the positive and negative sheets of the sheet capacitor of the embodiment 12. The negative sheet and the positive sheet are made of aluminum.

A negative electrode (hereinafter called electrode) 173 is formed at one side of a negative sheet (hereinafter called sheet) 172 by expanding the surface area by etching. A positive electrode (hereinafter called electrode) 175 is formed at one side of a positive sheet (hereinafter called sheet) 174 by expanding the surface area by etching, and by chemical treatment. A separator 176 is impregnated with an electrolyte for driving and disposed between the electrode 173 and the electrode 175. The electrode 173 and the electrode 175 are facing each other across the separator 176. A sealing sheet 177 made of polymer material is laminated in the area excluding the electrode 173 and the electrode 175, on the surface of the sheets 172, 174 forming the electrode 173 and the electrode 175. Insulating sheets 178, 179 insulate the casing.

The sheet capacitor of the present embodiment having such configuration is fabricated in the following manner. On one side of each of the sheet 172 and the sheet 174 made of aluminum, portions for forming the electrode 173 and the electrode 175 are opened, and a sealing sheet 177 made of polymer material is laminated. On other side, the insulating sheets 178, 179 are laminated respectively. The sheet 172 and the sheet 174 is etched by immersing in an etching bath (not shown). Thus, electrodes 173, 175 are formed. The electrode 175 formed on the sheet 174 is immersed in a chemical treatment bath (not shown), and the electrode 175 is chemically treated. Forming through-holes and contact portions by pressing, the sheet 172 and the sheet 174 are fabricated.

In succession, the sheet 172 and the sheet 174 are disposed so that the electrode 173 and the electrode 175 are opposite to each other, and a separator 176 is placed between them. At this time, by heating the peripheral edge of the separator 176 by hot pressing or the like, the sealing sheet 177 is thermally diffused and sealed. Thus, the sheet capacitor is fabricated.

In this configuration, the electrodes 173,175 are integrally formed in part of the sheets 172, 174 made of aluminum. Accordingly, mutual connection of the sheets 172, 174 and the electrodes 173, 175 is not necessary, and the connection resistance is eliminated. As a result, the sheet capacitor of low ESR and a small number of parts is obtained.

EXEMPLARY EMBODIMENT 14

FIG. 32 is a sectional view showing a configuration of a sheet capacitor in an exemplary embodiment 14 of the present invention. A negative foil (hereinafter called foil) 181 is bonded to one side of a negative sheet (hereinafter called sheet) 180 made of a conductor. A positive foil (hereinafter called foil) 183 is bonded to one side of a positive sheet (hereinafter called sheet) 182 made of a conductor. The foils 181, 183 respectively function as a negative electrode and a positive electrode. The foil 181 and the foil 183 are disposed so as to be opposite to each other, and substantially spherical spacers 185 mixed in a driving electrolyte 184 are interposed between them. The diameter of the spacer 185 is, for example, 5 to 20 μm.

By using the electrolyte 184 in which the spacers 185 are mixed, a large amount of electrolyte is held between the foils per unit area while maintaining the insulation between the foils. It is because this constitution is smaller in specific volume than the sheet separator. Besides, depending on the diameter of the spacer 185, the electrode distance can be kept in an arbitrary narrow gap from several μm to tens of μm. The electrode distance of several μm which is hard to handle by the separator can be set freely depending on the diameter of the spacer 185. Hence, the electrolyte 184 can be formed in a thin layer, and the ESR is smaller.

A sealing sheet 186 seals the foil 181 and 183 together with the driving electrolyte 184 in which the spacers 185 are mixed. A negative connector (hereinafter called connector) 187 and a positive connector (hereinafter called connector) 189 are formed of an elastic conductor. In a contact portion 188, a negative pin 2B for connection of an IC 1 provided in a connector 187 is connected. In a contact portion 190, a positive pin 2A for connection of the IC 1 provided in a connector 189 is connected. A junction 191 electrically connects the sheet 180 and the connector 187, and the positive sheet 182 and connector 189, respectively.

In this constitution, since the contact portions 187, 189 are not in contact with the electrolyte usually, the contact portions 187, 189 can be made of elastic spring material. As a result, the reliability is enhanced when inserting in or removing from the IC 1. To prevent corrosion by electrolyte, preferably, the portions contacting with the electrolyte except for the foils 181, 183 of the sheets 180, 183 and the connectors 187,188 should be coated by gold-plating or insulation coating.

EXEMPLARY EMBODIMENT 15

FIG. 33 is a sectional view showing a configuration of a sheet capacitor in an exemplary embodiment 15 of the present invention. A negative sheet (hereinafter called sheet) 192 made of a conductor has a recess 193. A negative foil (hereinafter called foil) 194 is bonded to the sheet 192 in the recess 193. A positive sheet (hereinafter called sheet) 195 made of a conductor has a recess 196. A positive foil 197 is bonded to the positive sheet 195 in the recess 196. The foils 194 and 197 are disposed so as to be opposite to each other, and a separator 198 impregnated in a driving electrolyte is interposed between them. A sealing sheet 199 seals the foils 194 and 199 together with the separator 198. Other aspects of the configuration are the same as in the embodiment 12.

In this configuration, if the foils 194, 199 and separator 198 are laminated so that the thickness is increased, they can be accommodated easily. In the sealing process of the foils 194, 199 and the separator 198, the electrolyte is prevented from flowing out. When used in horizontal position, there is no fear of liquid leakage. Moreover, the sheet capacitor is prevented from being inserted in reverse direction.

EXEMPLARY EMBODIMENT 16

FIG. 34 is a perspective exploded view showing a configuration of a sheet capacitor in an exemplary embodiment 16 of the present invention, FIG. 35 is its sectional view, and FIG. 36 is a sectional view showing a state of connection of an IC to the sheet capacitor.

A negative foil (hereinafter called foil) 200 has through-holes 201 conforming to the pitch of connection pins (hereinafter called pins) 2 of an IC 1, and a contact portion 202B to which a negative pin (hereinafter called pin) 2B for connection of the IC 1 is connected. An insulating sheet 203 has through-holes 201 conforming to the pitch of the pins 2. By laminating the insulating sheet 203 at one side of the foil 200, a negative sheet is composed.

A positive foil (hereinafter called foil) 204 has through-holes 201 conforming to the pitch of the pins 2, and a contact portion 202A to which a positive pin (hereinafter called pin) 2A for connection of the IC 1 is connected. An insulating sheet 205 has through-holes 201 conforming to the pitch of the pins 2. By laminating the insulating sheet 205 at one side of the foil 204, a positive sheet is composed. The electrode foils 200, 204 respectively function as a negative electrode and a positive electrode.

A separator 206 is impregnated in a driving electrolyte (not shown), and is disposed between the foils 200 and 204. Thus, the foils 200 and 204 are facing each other via the separator 206. A sealing sheet 207 having an opening for fitting the separator 206 in the center is made of an insulating material such as polyethylene, PET, epoxy, melamine, or silicone resin. The sealing sheet 207 has through-holes 201 conforming to the pitch of the pins 2. The sealing sheet 207 is disposed between the foils 200 and 204, and bonds them integrally by adhesion or other method, and also seals the separator 206. Thus, a sheet capacitor (hereafter called capacitor) 208 of the exemplary embodiment is composed.

In such configuration, the contact portions 202A, 202B to which the pins 2A, 2B of the IC 1 are connected are formed integrally in the foils 204, 200, respectively. Since the foils 200, 204 and the contact portions 202A, 202B are formed in a plane, the ESR is small. Since the foils 200, 204 are disposed closely to each other, the ESL is also small. The capacitor 208 can be connected at the root of the pins 2, effects of wiring pattern on the ESR or ESL are eliminated, and the number of parts is curtailed and it is easy to assemble.

It is preferred to seal the separator 206 interposed between the foils 200 and 204 by evacuating to less than the atmospheric pressure. As a result, the foils 200, 204 tightly contact with each other via the separator 206, and the electrode gap is stable, and changes of the characteristics are smaller.

The capacitor 208 having such configuration has through-holes 201 for passing the pins 2. Of the through-holes 201, only in the through-holes 201 for passing the pins 2 necessary for connection of the IC 1, contact portions 202A, 202B (black solid portions in the drawings) conducting with the pins 2 are formed. By passing the pins 2 of the IC 1 through the through-holes 201 of the capacitor 208 and fitting to the IC socket 3, the capacitor 208 conducts with the IC 1 via the contact portions 202A, 202B.

In FIG. 36, pins 2 are not connected to the through-holes 201A. In the through-holes 201B, pin 2A is connected via the contact portion 202A. In the through-hole 201C, pin 2B is connected via the contact portion 202B.

FIG. 37 shows a configuration of the contact portion of the positive sheet, in which the left side shows the state before insertion of the pin 2A, the right side shows the state after insertion. A substantially cross-shaped slit 208 is formed in the contact portion 202A conducting with the pin 2A provided in the foil 204. The slit 208 may also be formed substantially in a Y-shape. The slit 208 is covered with an elastic insulating sheet 205 having an opening 209 slightly larger than the diameter of the pin 2A.

In this configuration, the pin 2A is inserted by reaming the slit 208 formed in the contact portion 202A. At this time, the elastic insulating sheet 205 applies a force compressing from the peripheral edge of the contact portion 202A toward the center of the opening 209 so that the contact portion 202A may not be expanded. Therefore, if the foil 204 is composed of non-elastic material, a proper contact pressure can be applied to the pin 2A, and the contact stability of the pin 2A and contact portion 202A is enhanced. The contact portion 202B may be similarly composed.

FIG. 38 shows a case of lamination of a plurality of the foils of the sheet capacitor of the present embodiment. A first negative foil (hereinafter called foil) 210 and a first positive foil (hereinafter called foil) 211 are formed substantially with the same size. A second negative foil (hereinafter called foil) 212, a second positive foil (hereinafter called foil) 213, and a separator 214 are formed substantially with the same size, and are formed smaller than the foils 210, 211.

Between the thus formed foils 210 and 211, the foils 213, 212 are laminated alternately via the interposing separator 214. The foils 210, 212, and foils 213, 211 are respectively connected electrically by pressure fitting or other method. Later, the peripheral edge of the separator 214 is sealed by a sealing sheet (not shown). In this manner, the sheet capacitor is assembled. The capacity can be increased easily in this configuration.

EXEMPLARY EMBODIMENT 17

FIG. 39 is a sectional view showing a configuration of a sheet capacitor in an exemplary embodiment 17 of the present invention. An insulating sheet 216 is laminated at one side of a negative foil (hereinafter called foil) 215. The insulating sheet 216 is formed smaller than the foil 215, or part of the peripheral edge is notched, and at least part of the peripheral edge of the foil 215 is not covered with the sheet 216. The uncovered portion of the foil 215 composes a negative connection terminal (hereinafter called terminal) 217. Thus, a negative sheet is formed. An insulating sheet 219 is laminated at one side of a positive foil (hereinafter called foil) 218. The insulating sheet 219 is formed same as the negative sheet, and the uncovered portion of the foil 218 composes a positive connection terminal (hereinafter called terminal) 220. Thus, a positive sheet is formed. The electrode foils 215, 218 respectively function as a negative electrode and a positive electrode.

A separator 221 is inserted between the mutually opposite foils 215 and 218. The separator 221 is impregnated with an electrolyte (not shown). A sealing sheet 222 placed between the foils 215 and 218 has an opening for fitting the separator 221 and through-holes 201 conforming to the pitch of the connection pins (hereafter called pins) 2 of the IC 1 as in FIG. 36. The sealing sheet 222 seals the separator 221, and also bonds the foils 215 and 218, thereby forming an electrode portion.

A negative connector (hereinafter called connector) 223 has through-holes 224 conforming to the pitch of the pins 2, and a contact portion 225 for connecting the negative pin 2B for connection of the IC 1. The connector 223 is electrically connected to the terminal 217 provided in the negative sheet by fusion, welding or other method. A positive connector (hereinafter called connector) 226 has through-holes 227 conforming to the pitch of the pins 2, and a contact portion 228 for connecting the positive pin 2A for connection of the IC 1. The connector 226 is electrically connected to the terminal 220 provided in the positive sheet by fusion, welding or other method. Thus, separating the electrode portion and the contact portions, a sheet capacitor of the present embodiment is composed.

In this configuration, the individual contact portions 225, 228 to which the pins 2B, 2A are connected can be composed of an elastic spring material. As a result, the reliability of inserting in and removing from the IC 1 is much enhanced. Moreover, since the foils 215, 218 themselves serve terminals 217, 220, the ESR is reduced. The foils 215, 218 are adjacent to each other closely, so the ESL is also reduced. In structure, the overall thickness of the sheet capacitor is reduced.

EXEMPLARY EMBODIMENT 18

FIG. 40 is a sectional view showing a configuration of a sheet capacitor in an exemplary embodiment 18 of the invention. A negative cover (hereinafter called cover) 230 and a positive cover (hereinafter called cover) 235 are composed of a conductive elastic metal material. The cover 230 has through-holes 231 conforming to the pitch of the connection pins (hereinafter called pins) 2 of the IC 1 as in FIG. 36, and a contact portion 232 to which the negative pin 2B for connection of the IC 1 is connected. In the center at one side of the cover 230, a negative foil (hereinafter called foil) 229 is electrically bonded via a junction 233 by fusion, welding, pressure fitting or other method. The cover 235 has through-holes 236 conforming to the pitch of the pins 2, and a contact portion 237 to which the positive pin 2A for connection of the IC 1 is connected. In the center at one side of the cover 235, a positive foil (hereinafter called foil) 234 is electrically bonded via a junction 238 by fusion, welding, pressure fitting or other method. The foils 229, 234 respectively function as a negative electrode and a positive electrode.

A separator 239 is formed smaller than the foils 229 and 234, and is impregnated with an electrolyte (not shown). The separator 239 is inserted between the mutually opposite foils 229 and 234. A sealing sheet 240 has an opening for fitting the separator 239 and through-holes 201 conforming to the pitch of the pins 2. The sealing sheet 240 is disposed between the foils 229 and 234, and the cover 230 and cover 235, and seals the separator 239, and also bonds integrally the foils 229, 234, and the covers 230, 235. Thus, a sheet type electrolytic capacitor of the present embodiment is composed.

In this configuration, by the foils 229, 234 and sealing sheet 240, the separator 239 impregnated in the electrolyte is sealed. Therefore, the covers 230, 235 are free from effects of chemical reaction by the electrolyte for driving. Hence, the material for composing the covers 230, 235 can be selected primarily from the viewpoint of spring property, suitability to the contact portions 232, 237, and physical properties for guarding the electrode portion. For example, SUS, phosphor bronze for spring, or nickel silver for spring may be used. Therefore, the reliability of insertion and removal of the pins 2 and external strength of the sheet capacitor are enhanced. The contact between the contact portions 232, 237 so the pins 2 is secure, and the ESR is smaller. The electrode foils 229, 234 are adjacent to each other closely, so the ESL is reduced.

The material for composing the sealing sheet 240 is preferably a sheet polymer material. In particular, it is preferred to compose by thermally fusing PET or polyethylene (PE), curing silicone, epoxy or melamine resin, or using adhesive sheet (including core material).

EXEMPLARY EMBODIMENT 19

FIG. 41 is a sectional view showing a configuration of a sheet capacitor in an exemplary embodiment 19 of the present invention. A negative foil (hereinafter called foil) 200 has through-holes 201 conforming to the pitch of the connection pins (hereinafter called pins) 2 of the IC 1 as in FIG. 36, and a contact portion 202B to which the negative pin 2B for connection of the IC 1 is connected. An insulating sheet 203 has through-holes 201 conforming to the pitch of the pins 2, and is laminated to one side of the foil 200. Thus, a negative sheet is composed. A positive foil (hereinafter called foil) 204 has through-holes 201 conforming to the pitch of the pins 2, and a contact portion 202A to which the positive pin 2A for connection of the IC 1 is connected. In the sheet capacitor of the present embodiment, the negative foils 200 of two negative sheets are disposed face to face, and the positive foil 204 is placed between them. The foils 200, 204 respectively function as the a negative electrode and a positive electrode.

Substantially spherical insulating spacers (hereinafter called spacers) 241 are 5 to 20 μm in diameter, and the spacers 241 are mixed in an electrolyte 242. The electrolyte 242 is injected between the mutually opposite foils 200 and 204. A sealing sheet 207 has an opening for fitting the electrolyte 242 mixing the spacers 241 and through-holes 201 conforming to the pitch of the pins 2. The sealing sheet 207 seals the electrolyte 242, and integrally bonds the foils 200 and 204. In this way, a sheet capacitor of the present embodiment is composed.

In this configuration, only by laminating the foil 200, foil 204, and sealing sheet 207 identical in shape, the capacitor capacity is increased easily by the number of layers laminated. Therefore, the capacitor capacity can be easily customized. By laminating, moreover, the ESR is reduced by the number of layers laminated, and the ESR can be easily designed.

Further, by using the electrolyte 242 with the spacers 241, the volume of the electrolyte between the foils per unit area can be increased while maintaining the insulation between the foils. It is because this configuration is smaller in specific volume than the sheet separator. The electrode foil interval of several μm difficult in handling in the separator can be set arbitrarily by the diameter of the spacer 241. Therefore, the layer of the electrolyte 242 can be reduced in thickness. As a result, the ESR can be reduced.

EXEMPLARY EMBODIMENT 20

FIG. 42 is a perspective exploded view showing an IC socket using a sheet capacitor in an exemplary embodiment 20 of the present invention, and a state of its use. Connection pins (hereinafter called pins) 2 are provided at the lower side of an IC 1 represented by a CPU. This embodiment shows an example of using an IC package of 478 pins.

An IC socket (hereinafter called socket) 3 has a slide portion 243 having a sheet capacitor (hereinafter called capacitor) 253, and a bracket portion 244 soldered to a printed wiring board (hereinafter called board) 4. The slide portion 243 has a plurality of through-holes 245 for passing the pins 2 provided corresponding to the pins 2. Of the through-holes 245, only in the through-holes 245 for passing the pins 2 necessary for connection of the IC 1, contact portions 246 (solid black portions in the drawing) conducting with the pins 2 are formed.

The bracket portion 244 similarly has through-holes 247 corresponding to the through-holes 245 provided in the slide portion 243. Further, the bracket portion 244 has a pair of opposite guides 248 at the front side and inner side (not shown) in the drawing. The guides 248 are engaged with the slide portion 243 to hold slidably in the lateral direction in the drawing. The bracket portion 244 has a shaft hole 249, a cam 250 rotating about the shaft hole 249, and a lever 251 for rotating the cam 250, as the drive mechanism of the slide portion 243. As shown in FIG. 44, of the through-holes 247, in the through-holes 247 for passing the pins 2 necessary for connection of the IC 1, fixed contact points 265 for conducting with the pins 2 are formed. The fixed contact points 265 are provided at the moving side of the pins 2 by the manipulation of a drive mechanism 266 mentioned below.

FIG. 43 is a perspective exploded view of a slide portion 243 for composing the socket 3. A capacitor element 252 is installed in a capacitor 253. The capacitor element 252 has a positive foil (hereinafter called foil) 254 forming a dielectric oxide film on the surface. A conductive polymer film not shown is formed on the foil 254, and a negative layer 255 made of carbon and silver paste is laminated thereon.

The foil 254 is connected to a conductive positive sheet (hereinafter called sheet) 256 of SUS or phosphor bronze for spring serving also as a positive wiring by welding or by using conductive adhesive such as silver or carbon paste. As a result, the foil 254 is connected to the pins 2 of the IC 1 via the positive side contact portion 257. The negative layer 255 is connected to a conductive negative sheet (hereinafter called sheet) 258 of SUS or phosphor bronze for spring serving also as a negative wiring by welding or by using conductive adhesive such as silver or carbon paste. As a result, the negative layer 255 is connected to the pins 2 via the negative side contact portion 259. Further, the sheets 256, 258 are insulated by an insulating sheet 260 disposed between them. The insulating sheet 260 is made of polymer material such as PET, PC, PVC (polyvinyl chloride), PA, PI, PAI, etc. Thus, the capacitor 253 is composed.

The capacitor 253 is covered with a slide cover 262 slidably engaged and held with the bracket portion 244 and covered with an insulating sheet 263.

The operation of the socket 3 composed by including the capacitor 253 is explained below by referring to FIG. 44. First, the pins 2 of the IC 1 are inserted into the through-holes 245 in the socket 3. In this state, by manipulating the lever 251 of the drive mechanism 266, the cam 250 rotates in the arrow direction in the drawing. Consequently, the cam 250 pushes the protrusion 264 of the slide portion 243 in the left direction in the drawing, and the slide portion 243 moves in the same direction and reaches the position indicated by dotted lines in the drawing. As a result, the fixed contact points 265 and the contact portions 257, 259 pinch and lock the pins 2, and the pins 2 and the contact portions 257, 259 are mutually connected and conduct electrically.

Or, by a reverse operation of this operation, the fixed contact points 265 and the contact portions 257, 259 are released from the pins to return to the initial state. In an unlocked state, the pins 2 can be easily removed from the socket 3. Thus, with the through-holes 245 of the slide portion 243 and the through-holes 245 of the sheet capacitor 253 in the state of coincidence, the pins 2 can be easily inserted in or removed from the through-holes.

In FIG. 44, other electronic components 268 are mounted on the board 4, and a recess 267 formed in the capacitor 253 is intended to avoid projection of the IC 1.

In the thus composed socket 3, the electronic components such as capacitor elements 252 can be connected from the root of the pins 2 of the IC 1. Therefore, the connection distance between the electronic components such as capacitor elements 252 and the IC 1 is shorter, and the line inductance (ESL) and line resistance (ESR) can be suppressed low.

EXEMPLARY EMBODIMENT 21

FIGS. 45A, 45B show a configuration of a contact portion of an IC socket using a sheet capacitor in an exemplary embodiment 21 of the present invention.

A through-hole (hereinafter called hole) 245 for inserting a connection pin (hereinafter called pin) 2 of an IC 1 is formed larger than the pin 2. A through-hole (hereinafter called hole) 247 is provided in a bracket portion 244 of a socket 3. A semicircular through-hole (hereinafter called hole) 269 having a straight portion is formed in an elastic conductive sheet. A slit 270 is formed adjacently to the through-hole 269. An elastic contact portion 271 is formed between the through-hole 269 and the slit 270.

In the contact portion 271, as shown in FIG. 45B, when the slide portion 243 as in FIG. 44 moves in the arrow direction in the drawing by inserting the pin 2 of the IC 1, the holes 245, 269 also move in the same direction. Accordingly, both ends of the elastic contact portion 271 pinching the pin 2 are deformed so as to be pulled to the side of the hole 269. By this deformation, if the pitch of the pins 2 is deviated, the pin 2 and the contact portion 271 contact securely with each other by the elastic contact portion 271. In the state in FIG. 21A, since the hole 247 of the bracket portion 244 does not contact with the pin 2, the pin 2 can be inserted and removed easily.

FIGS. 46A, 46B are plan views showing another example of the contact portion, and FIGS. 46C, 46D are corresponding sectional views. A through-hole (hereinafter called hole) 272 is formed in an elastic conductive positive sheet (hereinafter called sheet) 256, and has an internal protrusion. An elastic contact portion 273 is formed by folding the protrusion, when inserting the pin 2 into the hole 272. In the negative conductive sheet (hereinafter called sheet) 258 at the opposite electrode side, an opening 274 is formed largely so as not to conduct with the pin 2. An insulating sheet 260 keeps insulation between the sheets 256 and 258. A cover sheet 262 covers the sheets 256. A fixed contact point 265 is provided in a hole 247.

In the thus composed contact portion 273, as shown in FIGS. 46B, 46D, when the slide portion 243 moves in the arrow direction in the drawing by inserting the pin 2, the holes 245, 272 also move in the same direction. Accordingly, the elastic contact portion 273 pinching the pin 2 together with the fixed contact point 265 is deformed so as to be deflected to the outside. By this deformation, if the pitch of the pins 2 is deviated, the pin 2 and the contact portion 273 contact securely with each other by the elastic contact portion 273. In the state in FIGS. 22A, 22C, since the hole 247 of the bracket portion 244 and the fixed contact portion 265 do not contact with the pin 2, the pin 2 can be inserted and removed easily.

EXEMPLARY EMBODIMENT 22

FIGS. 47A to 47C are manufacturing process charts of a positive sheet, insulating sheet, and a negative sheet, showing the stages from raw materials to a pressing step, in a manufacturing method of a sheet capacitor in an exemplary embodiment 22 of the present invention. A negative sheet (hereinafter called sheet) 275 is composed of spring material such as phosphor bronze for spring or SUS, or copper, iron or aluminum sheet, or a conductive sheet laminating an elastic film and a metal foil. The thickness of the sheet 275 is 0.05 to 0.3 mm. In the sheet 275, first of all, relief through-holes 276 not contacting with the connection pins (hereinafter called pins) 2 of the IC as in the former embodiments are formed at specified positions by a pressing process.

An insulating sheet (hereinafter called sheet) 277 is 0.01 to 0.3 mm in thickness, being made of insulating material such as PET, PP, PC sheet, or heat resistant insulating sheet such as PI, PAI, PEEK, or other polymer material. The sheet 277 has relief through-holes 278 passing all the pins 2 of the IC 1 without making contact, formed at specified positions, and has an opening 279 in the center formed by a pressing process.

A positive sheet (hereinafter called sheet) 280 is formed of the same material and in the same thickness as the sheet 275. In the sheet 280, relief through-holes 281 not contacting with the connection pins 2 of the IC 1 are formed at specified positions, and has an opening 282 in the center formed by a pressing process.

FIGS. 48A to 48C are manufacturing process charts showing a plan view, a front view, and a bottom view of the process from gluing step of the sheets 275, 277, 280 processed already as shown in FIG. 47 to the recess forming step. The process advances as shown from left to right in the drawing. First, the processed sheet 275 and sheet 280 are heated by a heater 283 to a temperature for fusing the sheet 277. The sheet 277 serving as an insulating layer is inserted between these sheets, and these sheets are laminated by pressing by rolls 284. In succession, to avoid the protrusion of the IC 1, a recess 286 is formed in the center by a forming press (hereinafter called press) 285. In this way, a wiring laminate sheet (hereinafter called sheet) 287 having negative and positive wiring patterns is fabricated.

It is preferred to heat the press 285 to a temperature for softening the sheet 277 when forming the sheet 287. As a result, the shape of the recess 286 is retained favorably. Or, by inserting the sheet 277 between the sheet 275 and the sheet 280, they can be glued together by ultrasonic fusion. Instead of providing the sheet 277, an insulating layer may be formed by printing a heat curing insulating paint or a UV curing insulating paint.

FIGS. 49A to 49C are manufacturing process charts showing a plan view, a front view, and a bottom view of the process from the forming step of contact portions on the sheet 287 processed already as shown in FIG. 48 to the mounting step of a capacitor element. The process advances as shown from left to right in the drawing. First, in the sheet 287, contact portions 288 (black solid portions in the drawing) to be connected to the pins 2 of the IC 1 are formed by using a press 289. Thus, by one press operation, holes are drilled simultaneously in the sheet 275 and sheet 280, and the contact portions 288 are formed, and therefore the pitch deviation of holes contacting with the pins 2 of the IC 1 is very small.

In the present embodiment, before forming the contact portions 288 on the sheets 275 and 280, a recess 286 is formed in the portions excluding the forming portions of the relief through-holes 276, 278, 281 and the contact portion 288. In this method, if deviation occurs when gluing the sheets 275 and the sheet 280, the recess 286 is formed stably. After forming the recess 286, by forming the contact portions 288 simultaneously and integrally, the contact portions 288 free from pitch deviation are formed.

Next, conductive paste (hereinafter called paste) 290 of silver, carbon, copper or the like is picked up by a tampon 291, and is transferred to the bottom (a negative electrode)

of the recess 286 formed in the sheet 287, and thus the paste 290 is applied. Successively, the negative electrode (hereinafter called electrode) 293 of a capacitor element 292 is tightly adhered to the paste 290 applied in the bottom of the recess 286. At this time, the capacitor element 292 is disposed so that a positive electrode (hereinafter called electrode) 294 of the capacitor element 292 may contact with a junction 295 of the sheet 280. And the paste 290 is dried.

In succession, the electrode 294 of the capacitor element 292 and the junction 295 of the sheet 280 are connected by electric welding 296, layer welding or other welding method. Thus, the sheet 287 and the capacitor element 292 are connected electrically. The capacitor element 292 is disposed in the integrated portion of the opening 279 provided in the center of the sheet 277 and the opening 282 provided in the center of the sheet 280. In this method, a small, thin, and compact sheet capacitor is obtained. Instead of the sheet 280, meanwhile, an opening may be also provided in the center of the sheet 275.

FIG. 50 is a plan view showing the shape of a hole composing the contact portion 288. The sheet 280 of the highest position has a relief through-hole 281 larger than the outer diameter of the pin 2. The sheet 277 formed at its lower position has a relief through-hole 278 smaller than the relief through-hole 281. The sheet 275 formed at a further lower position has an elliptical relief through-hole 276 formed partially smaller than the outer diameter of the pin 2. In this way, a negative side contact portion 288A is formed. In a positive side contact portion 288B, through-holes are formed in the reverse manner of the contact portion 288A. That is, the sheet 280 has an elliptical relief through-hole formed partially smaller than the outer diameter of the pin 2. Therefore, if the sheet 275, sheet 280, and sheet 277 are deviated, the sheet 277 covers the non-contacting relief through-hole and the insulation is increased. Besides, the connection stability is increased from the portion of the sheet 277 projecting from the relief through-hole. The elliptical relief through-hole provided in the sheets 275, 280 may also be rectangular or stellate having a portion partially smaller than the outer diameter of the pin 2 the same as in the case of the embodiment 1.

FIG. 51 is a sectional view showing a configuration of the capacitor element 292. On the outer surface of an electrode portion 294 made of aluminum foil forming a dielectric oxide film on the surface, a solid electrolyte layer 299 of functional polymer such as thiophene is formed. Further on this surface, an electrode position 293 of carbon or silver paste is formed. Thus, a sheet capacitor element 292 is composed. The capacitor element 292 is not particularly specified as far as a sheet can be formed, and may include, for example, tantalum capacitor element, ceramic capacitor element, wet electrolytic capacitor, electric double layer capacitor element, and sheet battery element.

FIGS. 52A, 52B are manufacturing process charts showing a plan view and a front view of the process from the gluing step of a cover sheet for protecting the capacitor element 292 mounted on the sheet 287 processed already as shown in FIG. 49 to the step of cutting into final pieces. The process advances from left to right as shown in the drawing. First, a cover sheet 301 made of an insulating polymer material having relief through-holes 300 for passing the pins 2 of the IC 1 is overlaid on the sheet 287. They are carried into a vacuum chamber 302 divided into upper and lower halves, and closed, and the vacuum chamber 302 is evacuated by a vacuum pump 303. When the vacuum chamber 302 is evacuated, the cover sheet 301 is pressed to the sheet 287 by using a hot press 304. Thus, the capacitor element 292 is sealed and fused, and is finally cut into individual pieces by using a cutting press 305. Thus, a sheet capacitor 306 is fabricated. The cover sheet 301 has an insulating layer. Instead of evacuating the vacuum chamber 302 at sealing the capacitor element 292 in vacuum state of the cover sheet 301 and sheet 287, it is also possible to seal in an inert gas atmosphere. In such method, oxidation of the capacitor element 292 is prevented, and the reliability of the sheet capacitor is enhanced.

In this embodiment, the sheet 277 is disposed only on the top of the sheet 275, but, if necessary, the insulating sheet 277 may be fused or adhered to the bottom surface.

The insulating layer composed of the sheets 277, 301 may be formed by using insulating paint such as epoxy, melamine, silicone or polyurethane, insulating material such as PET, PP, PC sheet, or heat resistant insulating sheet of PI, PAI, PEEEK, etc. The sheets may be connected by adhering with adhesive agent (or tacky agent). The outer casing may be coated with resin molding, coated with insulating sheet, coated with coating material, or printed with insulating paint.

By forming the sheet 277 by printing heat curing or UV curing insulating paint, there is no problem of deviation of gluing of sheet 277 due to elongation or shrinkage of film in roll production. Besides, the sheet 277 may be formed of thermal reversible insulating sheet, and by heating the sheet 275 and sheet 280, they can be thermally adhered to the sheet 277. In this method, the sheet 277 can be kept at ordinary temperature until immediately before thermal adhesion, and deformation by heat can be kept at a minimum limit, and the sheets 275 and 280 can be thermally adhered in this state. As a result, a highly reliable sheet capacitor is obtained. Instead of thermal adhesion by heating, by thermally adhering the sheets 275, 277, 280 by ultrasonic waves, the same effects are obtained.

By additionally using the insulating sheet and the positive sheet, they can be laminated at the back side of the sheet 275, and a capacitor element of a different characteristic may be connected. In this method, it is easy to compose a sheet capacitor mounting different elements in batch, such as capacitor elements different in voltage, capacitor element composed of ceramic, functional polymer, or film different in characteristic, or a capacitor element and a battery element.

As described above, a first sheet capacitor of the invention has at least a contact portion formed in a through-hole requiring electrical connection with an IC connection pin among the through-holes in which IC connection pins are inserted, and at lease a capacitor element connected to the contact portion. A second sheet capacitor of the invention has a land for connection with an IC on the upper side, and a land for connection with a printed circuit board on the lower side. At least a capacitor element is connected electrically to these lands for connection. In either one of these configurations, a capacitor element of large capacity and low ESL is connected closely to the IC, and the mounting area of the peripheral circuits of the IC can be increased. A third sheet capacitor of the invention includes a positive sheet having a positive electrode on one side, a negative sheet having a negative electrode on one side, an electrolyte disposed between the two sheets, and a sealing sheet for sealing the electrolyte. The sealing sheet is disposed between the positive sheet and the negative sheet, and is integrally bonded to the positive sheet and the negative sheet. In this configuration, from the positive sheet and the negative sheet, electricity can be directly supplied to the positive electrode and the negative electrode, respectively. Besides, the electric conductive paths of the negative sheet and the positive sheet are tightly close to each other. Therefore, a capacitor lower in the ESL and ESR is obtained. Structurally, moreover, since the thickness of the capacitor is reduced, the peripheral circuits of the IC can be mounted at high density.

An IC socket of the invention has a slide portion having the first sheet capacitor, and a bracket portion slidably engaged with the slide portion. The bracket portion is bonded to a printed circuit board. The bracket portion has through-holes in which IC connection pins are inserted. Of these through-holes, the through-holes requiring electrical connection with the IC connection pins have fixed contact points. The bracket portion also has a cam and a lever for sliding the slide portion. In this configuration, with the through-holes of the slide portion matched with the through-holes of the sheet electronic component, the connection pins of the IC can be easily inserted in or removed from the through-holes. In use, an elastic force acts in a direction of pinching each of the connection pins of the IC by the contact portion of the through-hole of the slide portion and the fixed contact point, and the connection pins are locked, and the contact portions and the connection pins are securely connected electrically.

In a method of manufacturing a sheet capacitor of the invention, first, an insulating sheet is placed between a conductive negative sheet and a conductive positive sheet. The insulating sheet has relief through-holes preliminarily formed in the contact-free fitting portions of all IC connection pins. The negative sheet and the positive sheet have relief through-holes larger than the outer diameter of the connection pins previously formed in the portions not contacting with the connection pins. The negative sheet, the insulating sheet and the positive sheet are laminated in a state so that the individual relief through-holes are in coincidence. The contact portions to be connected to the connection pins are formed integrally with the negative sheet and the positive sheet simultaneously. The contact portions are formed in the through-holes requiring electrical connection with the connection pins among the through-holes in which the IC connection pins are fitted. In this method, the sheet capacitor small in pitch deviation from the connection pins of the IC can be presented stably.

The features of the embodiments of the present invention described above can be executed by combining in possible ranges, and such combinations are included in the scope of the present invention.

What is claimed is:

1. A sheet capacitor comprising:
   a contact portion formed in a through-hole requiring electrical connection with an IC connection pin among through-holes in which IC connection pins are inserted, and
   a capacitor element connected to the contact portion,
   wherein the contact portion is formed in an elliptical shape having a major diameter longer than a diameter of the connection pin, and a minor diameter shorter than the diameter of the connection pin.

2. The sheet capacitor of claim 1, further comprising:
   a board having the contact portion and mounting the capacitor element.

3. The sheet capacitor of claim 1,
   wherein a recess is formed in a center, and the capacitor element is disposed in the recess.

4. The sheet capacitor of claim 1,
   wherein a pair of slits are provided at both sides in the mirror diameter direction of the contact portion.

5. A sheet capacitor comprising,
   a contact portion formed in a through-hole requiring electrical connection with an IC connection pin among through-holes in which IC connection pins are inserted, and
   a capacitor element connected to the contact portion,
   wherein the contact portion is formed in a stellate shape having a maximum diameter longer than a diameter of the connection pin, and a minimum diameter shorter than the diameter of the connection pin.

6. The sheet capacitor of claim 5, further comprising:
   a board having the contact portion and mounting the capacitor element.

7. The sheet capacitor of claim 5,
   wherein a recess is formed in a center, and the capacitor element is disposed in the recess.

* * * * *